United States Patent
Moriyasu

(10) Patent No.: US 11,114,588 B2
(45) Date of Patent: Sep. 7, 2021

(54) SEMICONDUCTOR LIGHT EMITTING ELEMENT

(71) Applicant: USHIO DENKI KABUSHIKI KAISHA, Tokyo (JP)

(72) Inventor: Kengo Moriyasu, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/484,330

(22) PCT Filed: Feb. 7, 2018

(86) PCT No.: PCT/JP2018/004194
§ 371 (c)(1),
(2) Date: Aug. 7, 2019

(87) PCT Pub. No.: WO2018/147320
PCT Pub. Date: Aug. 16, 2018

(65) Prior Publication Data
US 2019/0386179 A1 Dec. 19, 2019

(30) Foreign Application Priority Data
Feb. 8, 2017 (JP) .............................. JP2017-021647

(51) Int. Cl.
*H01L 33/38* (2010.01)
*H01L 33/40* (2010.01)
*H01L 33/32* (2010.01)

(52) U.S. Cl.
CPC .............. *H01L 33/38* (2013.01); *H01L 33/40* (2013.01); *H01L 33/405* (2013.01); *H01L 33/32* (2013.01); *H01L 33/325* (2013.01)

(58) Field of Classification Search
CPC ............................................... H01L 33/36–42
See application file for complete search history.

(56) References Cited

U.S. PATENT DOCUMENTS 7,947,997 B2 * 5/2011 Jeong ................... H01L 33/387
257/98
8,143,639 B2 * 3/2012 Jeong ................... H01L 33/22
257/98

(Continued)

FOREIGN PATENT DOCUMENTS

DE 102015114590 A1 * 3/2017 ........... H01L 33/387
EP 1806790 A2 * 12/2006 ............. H01L 33/00

(Continued)

OTHER PUBLICATIONS

Machine translation, Fudeta, Japanese Pat. Pub. No. JP 2010-027643, translation date: Sep. 2, 2020, Espacenet, all pages. (Year: 2020).*

(Continued)

*Primary Examiner* — Victoria K. Hall
(74) *Attorney, Agent, or Firm* — Studebaker & Brackett PC

(57) ABSTRACT

A semiconductor light emitting element according to the present invention is obtained by forming a first semiconductor layer, an active layer, and a second semiconductor layer on a substrate. The semiconductor light emitting element includes a first insulating layer, a first electrode, and a second electrode. The first insulating layer is formed in a position closer to the substrate than the first semiconductor layer in a first direction orthogonal to a surface of the substrate and is formed so as to protrude outward from a first surface being a surface on a side of the substrate of the first semiconductor layer as seen in the first direction. A first region where the first surface and the first insulating layer face each other and a second region where the first surface and the first electrode face each other are spaced apart in a direction parallel to the surface of the substrate.

12 Claims, 27 Drawing Sheets

(56) References Cited

U.S. PATENT DOCUMENTS

| | | | | |
|---|---|---|---|---|
| 8,269,234 B2* | 9/2012 | Cho | H01L 33/0093 | 257/94 |
| 8,283,687 B2* | 10/2012 | Lee | H01L 33/36 | 257/98 |
| 8,319,244 B2* | 11/2012 | Jeong | H01L 33/42 | 257/98 |
| 8,354,664 B2* | 1/2013 | Moon | H01L 33/44 | 257/13 |
| 8,368,107 B2* | 2/2013 | Bae | H01L 33/44 | 257/98 |
| 8,410,510 B2* | 4/2013 | Matsumura | H01L 33/387 | 257/99 |
| 8,513,679 B2* | 8/2013 | Jeong | H01L 33/44 | 257/79 |
| 8,674,389 B2* | 3/2014 | Jeong | H01L 33/42 | 257/98 |
| 8,686,429 B2* | 4/2014 | Bergmann | H01L 33/08 | 257/76 |
| 8,766,300 B2* | 7/2014 | Jeong | H01L 33/405 | 257/98 |
| 8,901,597 B2* | 12/2014 | Jeong | H01L 33/44 | 257/99 |
| 8,916,883 B2* | 12/2014 | Jeong | H01L 33/38 | 257/79 |
| 8,987,920 B2* | 3/2015 | Cho | H01L 33/0093 | 257/783 |
| 9,029,888 B2* | 5/2015 | Kim | H01L 33/382 | 257/98 |
| 9,153,747 B2* | 10/2015 | Liao | H01L 33/38 | |
| 9,166,113 B2* | 10/2015 | Lee | H01L 33/14 | |
| 9,196,798 B2* | 11/2015 | Yen | H01L 33/14 | |
| 9,246,059 B2* | 1/2016 | Miyoshi | H01L 33/0075 | |
| 9,324,917 B2* | 4/2016 | Katsuno | H01L 33/20 | |
| 9,548,423 B2* | 1/2017 | Chien | H01L 33/387 | |
| 9,741,913 B2* | 8/2017 | Tokunaga | H01L 33/0093 | |
| 9,755,112 B2* | 9/2017 | Huang | H01L 33/405 | |
| 9,842,974 B2* | 12/2017 | Jeong | H01L 33/385 | |
| 9,893,254 B1* | 2/2018 | Chou | H01L 33/10 | |
| 9,899,581 B2* | 2/2018 | Choi | H01L 33/44 | |
| 10,115,860 B2* | 10/2018 | Haberern | H01L 33/08 | |
| 10,797,201 B2* | 10/2020 | Haberern | H01L 33/08 | |
| 10,957,830 B2* | 3/2021 | Williams | H01L 33/08 | |
| 2003/0141506 A1* | 7/2003 | Sano | H01L 33/38 | 257/78 |
| 2003/0222270 A1* | 12/2003 | Uemura | H01L 33/40 | 257/99 |
| 2005/0211993 A1* | 9/2005 | Sano | H01L 33/22 | 257/79 |
| 2005/0211997 A1* | 9/2005 | Suehiro | H01L 33/405 | 257/88 |
| 2007/0290215 A1* | 12/2007 | Kato | H01L 33/0093 | 257/79 |
| 2008/0006836 A1* | 1/2008 | Lee | H01L 33/387 | 257/98 |
| 2008/0042145 A1* | 2/2008 | Hagleitner | H01L 33/40 | 257/79 |
| 2009/0057707 A1* | 3/2009 | Katsuno | H01L 33/405 | 257/99 |
| 2009/0072257 A1* | 3/2009 | Unno | H01L 33/387 | 257/98 |
| 2009/0283787 A1* | 11/2009 | Donofrio | H01L 33/62 | 257/98 |
| 2010/0006881 A1* | 1/2010 | Seo | H01L 33/0093 | 257/98 |
| 2010/0155693 A1* | 6/2010 | Seo | H01L 27/153 | 257/13 |
| 2010/0163894 A1* | 7/2010 | Uemura | H01L 33/38 | 257/95 |
| 2010/0264442 A1* | 10/2010 | Lee | H01L 33/36 | 257/98 |
| 2011/0031519 A1* | 2/2011 | Hirao | H01L 21/6835 | 257/98 |
| 2011/0049550 A1* | 3/2011 | Katsuno | H01L 33/46 | 257/98 |
| 2011/0089450 A1* | 4/2011 | Jeong | H01L 33/145 | 257/98 |
| 2011/0215352 A1* | 9/2011 | Jeong | H01L 33/44 | 257/94 |
| 2011/0220935 A1* | 9/2011 | Gotoda | H01L 33/405 | 257/98 |
| 2011/0291140 A1* | 12/2011 | Choi | H01L 33/40 | 257/98 |
| 2012/0018757 A1* | 1/2012 | Jeong | H01L 33/32 | 257/98 |
| 2012/0273823 A1* | 11/2012 | Yoneda | H01L 33/62 | 257/98 |
| 2012/0305964 A1* | 12/2012 | Akaike | H01L 33/405 | 257/98 |
| 2013/0032845 A1* | 2/2013 | Chuang | H01L 33/0093 | 257/99 |
| 2013/0153950 A1* | 6/2013 | Mizutani | H01L 33/40 | 257/99 |
| 2013/0234182 A1* | 9/2013 | Katsuno | H01L 33/405 | 257/98 |
| 2013/0285011 A1* | 10/2013 | Kojima | H01L 33/54 | 257/13 |
| 2013/0285077 A1* | 10/2013 | Kojima | H01L 25/0753 | 257/88 |
| 2014/0001502 A1* | 1/2014 | Akimoto | H01L 33/382 | 257/98 |
| 2014/0070247 A1* | 3/2014 | Yen | H01L 33/14 | 257/98 |
| 2014/0084240 A1* | 3/2014 | Hu | H01L 33/0093 | 257/13 |
| 2014/0151711 A1* | 6/2014 | Yen | H01L 33/44 | 257/76 |
| 2014/0167065 A1* | 6/2014 | Bergmann | H01L 33/32 | 257/76 |
| 2014/0203296 A1* | 7/2014 | Sugawara | H01L 33/0093 | 257/76 |
| 2014/0227813 A1* | 8/2014 | Yoneda | H01L 33/62 | 438/33 |
| 2014/0231851 A1* | 8/2014 | Tsai | H01L 33/385 | 257/98 |
| 2014/0312369 A1* | 10/2014 | Yoon | H01L 33/382 | 257/96 |
| 2014/0319455 A1* | 10/2014 | Miyachi | H01L 33/06 | 257/13 |
| 2014/0339587 A1* | 11/2014 | Kawaguchi | H01L 33/36 | 257/98 |
| 2015/0060924 A1* | 3/2015 | Lin | H01L 33/42 | 257/98 |
| 2015/0084082 A1* | 3/2015 | Tanaka | H01L 33/40 | 257/98 |
| 2015/0144980 A1* | 5/2015 | Tsai | H01L 33/46 | 257/98 |
| 2015/0155442 A1* | 6/2015 | Chien | H01L 33/44 | 257/98 |
| 2015/0171271 A1* | 6/2015 | Inoue | H01L 33/38 | 257/98 |
| 2015/0171298 A1* | 6/2015 | Cho | H01L 33/44 | 257/98 |
| 2015/0207051 A1* | 7/2015 | Yoon | H01L 33/14 | 362/382 |
| 2015/0236209 A1* | 8/2015 | Pfeuffer | H01L 33/20 | 257/99 |
| 2015/0280066 A1* | 10/2015 | Fujimura | H01L 33/46 | 257/98 |
| 2015/0280072 A1* | 10/2015 | Nunotani | H01L 33/60 | 257/98 |
| 2015/0280073 A1* | 10/2015 | Miyoshi | H01L 33/387 | 257/98 |
| 2015/0287886 A1* | 10/2015 | Huang | H01L 33/405 | 257/98 |
| 2015/0349207 A1* | 12/2015 | Sogo | H01L 33/0093 | 257/99 |
| 2015/0372208 A1* | 12/2015 | Chae | H01L 33/38 | 257/98 |

(56) References Cited

U.S. PATENT DOCUMENTS

| | | | |
|---|---|---|---|
| 2016/0056327 A1* | 2/2016 | Sugiyama | H01L 33/007 257/13 |
| 2016/0064602 A1* | 3/2016 | Yen | H01L 33/14 257/98 |
| 2016/0072019 A1* | 3/2016 | Katsuno | H01L 33/32 257/98 |
| 2016/0079467 A1* | 3/2016 | Totani | H01L 33/0095 257/76 |
| 2016/0163923 A1* | 6/2016 | Kuo | H01L 33/145 257/98 |
| 2016/0181479 A1* | 6/2016 | Kim | H01L 33/58 257/98 |
| 2016/0211416 A1* | 7/2016 | Huang | H01L 33/40 |
| 2016/0268478 A1* | 9/2016 | Tomizawa | H01L 33/44 |
| 2016/0284940 A1* | 9/2016 | Kawaguchi | H01L 33/382 |
| 2017/0077367 A1* | 3/2017 | Shimojuku | H01L 33/44 |
| 2017/0084788 A1* | 3/2017 | Sugiyama | H01L 33/405 |
| 2017/0092814 A1* | 3/2017 | Chien | H01L 33/44 |
| 2017/0162745 A1* | 6/2017 | Moriyasu | H01L 33/22 |
| 2017/0170361 A1* | 6/2017 | Kuo | H01L 33/32 |
| 2017/0345973 A1* | 11/2017 | Hirao | H01L 33/405 |
| 2018/0351045 A1* | 12/2018 | Meng | H01L 33/42 |
| 2019/0027649 A1* | 1/2019 | Yoon | H01L 33/24 |
| 2019/0378873 A1* | 12/2019 | Lee | H01L 33/50 |
| 2020/0091376 A1* | 3/2020 | Lim | H01L 33/56 |
| 2020/0287076 A1* | 9/2020 | Choi | H01L 33/382 |

FOREIGN PATENT DOCUMENTS

| | | | | |
|---|---|---|---|---|
| EP | 2410583 B1 | * | 12/2020 | H01L 33/40 |
| GB | 2542542 A | * | 3/2017 | H01L 33/46 |
| JP | 2007184411 A | * | 7/2007 | H01L 21/02458 |
| JP | 2010-027643 A | | 2/2010 | |
| JP | 2014183295 A | * | 9/2014 | H01L 33/44 |
| JP | 2016-195176 A | | 11/2016 | |
| JP | 2016-195187 A | | 11/2016 | |
| JP | 2017-005157 A | | 1/2017 | |
| JP | 2017139271 A | * | 8/2017 | H01L 33/02 |
| WO | WO-2015141517 A1 | * | 9/2015 | H01L 33/32 |
| WO | WO-2016122076 A1 | * | 8/2016 | H01L 33/38 |
| WO | WO-2016158093 A1 | * | 10/2016 | H01L 33/40 |

OTHER PUBLICATIONS

Machine translation, Miyoshi, Japanese Pat. Pub. No. JP 2016-195176, translation date: Sep. 2, 2020, Espacenet, all pages. (Year : 2020).*

Machine translation, Takagi, Japanese Pat. Pub. No. JP 2016-195187, translation date: Sep. 2, 2020, Espacenet, all pages. (Year: 2020).*

Machine translation, Tsukihara, Japanese Pat. Pub. No. JP 2017-005157, translation date: Sep. 2, 2020, Espacenet, all pages. (Year: 2020).*

Machine translation, Miyoshi, WIPO Pat. Pub. No. WO 2016-158093, translation date: Sep. 5, 2020, Espacenet, all pages. (Year: 2020).*

International Search Report issued in PCT/JP2018/004194; dated Mar. 20, 2018.

An Office Action; "Notification of Reasons for Refusal," mailed by the Japanese Patent Office dated Jun. 19, 2020, which corresponds to Japanese Patent Application No. 2017-021647 and is related to U.S. Appl. No. 16/484,330 with English language translation.

Notification of Transmittal of Translation of the International Preliminary Report on Patentability (Chapter I) and Translation of Written Opinion of the International Searching Authority; PCT/JP2018/004194; dated Aug. 22, 2019.

An Office Action mailed by the Korean Intellectual Property Office dated Oct. 27, 2020, which corresponds to Korean Patent Application No. 10-2019-7025146 and is related to U.S. Appl. No. 16/484,330; with English language translation.

* cited by examiner

SEMICONDUCTOR LIGHT EMITTING ELEMENT

TECHNICAL FIELD

The present invention relates to a semiconductor light emitting element.

BACKGROUND ART

In recent years, development of a semiconductor light emitting element referred to as a "vertical structure" is advanced. The vertical structure is intended to mean a structure in which an electrode (n-side electrode) in contact with an n-type semiconductor layer and an electrode (p-side electrode) in contact with a p-type semiconductor layer are arranged to face each other in a direction orthogonal to a surface of a substrate. An example of the semiconductor light emitting element having the vertical structure is disclosed in Patent Document 1 below.

FIG. 13 is a cross-sectional view schematically illustrating the semiconductor light emitting element disclosed in Patent Document 1. As illustrated in FIG. 13, a conventional semiconductor light emitting element 100 includes a substrate 101 and a semiconductor layer 110 formed on the substrate 101. The semiconductor layer 110 is obtained by laminating a p-type semiconductor layer 111, an active layer 112, and an n-type semiconductor layer 113.

An n-side electrode 121 is formed on the upper side of the n-type semiconductor layer 113. A p-side electrode 122 is formed on the lower side of the p-type semiconductor layer 111. The p-side electrode 122 is arranged in a region including a position facing the n-side electrode 121 in a direction orthogonal to a surface of the substrate 101. In the semiconductor light emitting element 100, since the n-type semiconductor layer 113 forms a light extraction surface, a material having high reflectivity is used for the p-side electrode 122. As an example, the p-side electrode 122 is made of Ag or Al.

A metal layer 103 for bonding is formed on the upper side of the substrate 101. A part of the metal layer 103 is in contact with the p-side electrode 122. In Patent Document 1, the substrate 101 provided in the semiconductor light emitting element 100 is a conductive substrate, and a power supply electrode 125 is formed on a rear surface of the substrate 101. Also, a current blocking layer 109 is provided for the purpose of suppressing concentration of current in a position directly below the n-side electrode 121.

Furthermore, an insulating layer 105 is provided on the upper side of the substrate 101 so that a part thereof is located outside the semiconductor layer 110. The insulating layer 105 is provided so as to serve as an etching stopper when the semiconductor layer 110 is etched in the direction orthogonal to the surface of the substrate 101 at an element isolation step. As illustrated in FIG. 13, the insulating layer 105 is formed in a region including a position below a region forming an outer edge of the semiconductor layer 110 and a position outside the semiconductor layer 110.

According to Patent Document 1, $SiO_2$ and SiN are preferably used as the insulating layer 105.

Prior Art Document

PATENT DOCUMENT

Patent Document 1: JP-A-2010-27643

SUMMARY OF THE INVENTION

Problems to be Solved by the Invention

According to the intensive researches of the present inventor, it was confirmed that the semiconductor light emitting element 100 as illustrated in FIG. 13 starts to decrease luminance when lighting is continued for a predetermined time or longer, and eventually reaches a non-lighting state. An object of the present invention is to realize a semiconductor light emitting element having a life characteristic superior to that of the conventional one.

Means for Solving the Problems

The present invention is a semiconductor light emitting element obtained by forming an n-type or p-type first semiconductor layer, an active layer formed on the upper side of the first semiconductor layer, and a second semiconductor layer formed on the upper side of the active layer having a conductivity type different from the conductivity type of the first semiconductor layer on a substrate, the semiconductor light emitting element provided with:

a first insulating layer formed in a position closer to the substrate than the first semiconductor layer in a first direction orthogonal to a surface of the substrate and formed so as to protrude outward from a first surface being a surface on a side of the substrate of the first semiconductor layer as seen in the first direction;

a first electrode made of a high reflective material located inside the first insulating layer as seen in the first direction and formed so as to be in contact with the first surface directly or via a thin film; and a second electrode formed so as to be in contact with a surface on a side opposite to the substrate of the second semiconductor layer, in which a first region where the first surface and the first insulating layer face each other and a second region where the first surface and the first electrode face each other are spaced apart in a second direction parallel to the surface of the substrate.

The present inventor considers as follows a reason for which a phenomenon occurs that the luminance decreases to reach the non-lighting state when the conventional semiconductor light emitting element continues to be turned on for a predetermined time.

The insulating layer 105 included in the semiconductor light emitting element 100 illustrated in FIG. 13 does not have a dense structure. Also, a minute gap is inevitably formed between the insulating layer 105 and the semiconductor layer 110 (p-type semiconductor layer 111). As illustrated in FIG. 13, since the insulating layer 105 is located outside the semiconductor layer 110, the insulating layer 105 has a region in contact with air. Therefore, the air may pass through the inside of the insulating layer 105 and reach the p-side electrode 122 provided in contact with the insulating layer 105.

When a lighting state of the semiconductor light emitting element 100 continues in this state, a material forming the p-side electrode 122 causes ion migration due to the presence of moisture included in the air adsorbed on a surface of the p-side electrode 122. For example, when the p-side electrode 122 is made of Ag, Ag ions (for example, $Ag^+$) generated by the ion migration are drawn to negative charge on a side of the n-side electrode 121 to move toward the outer edge along the vicinity of an interface between the semiconductor layer 110 and the p-side electrode 122 (refer to FIG. 14A).

Furthermore, the Ag ions move through the interface between the semiconductor layer 110 and the insulating layer 105, or in the insulating layer 105, and eventually reach a position outside the semiconductor layer 110. Thereafter, the Ag ions move to the side of the n-side electrode 121 through a surface of the semiconductor layer 110 or in the layer.

As the migration of the material (herein, Ag ions) forming the p-side electrode 122 further progresses, the Ag ions eventually reach the active layer 112, and a leak current path is formed in the semiconductor layer 110. As a result, an amount of current flowing in the active layer 112 decreases and the luminance of the semiconductor light emitting element 100 decreases. Meanwhile, when the migration further progresses, Ag ions reach the n-side electrode 121 (refer to FIG. 14B) and a complete leak is formed. After such a situation occurs, the semiconductor light emitting element 100 hardly lights up or does not light up.

According to the semiconductor light emitting element according to the present invention, the region where the surface (first surface) on the side of the substrate of the first semiconductor layer and the first insulating layer face each other and the region where the first surface and the first electrode face each other are spaced apart in a direction parallel to the surface of the substrate. That is, the first insulating layer and the first electrode are not in contact with each other on the surface or in the vicinity of the surface on the side of the substrate of the first semiconductor layer. As a result, even if the air penetrates the inside of the semiconductor light emitting element through the first insulating layer, the amount of the air reaching the surface of the first electrode may be decreased as compared to that in the conventional configuration. That is, according to the configuration of the present invention, as compared with the conventional configuration, progress of the migration of the material forming the first electrode is suppressed, so that a device life is improved.

More specifically, a region where the surface on the side of the first semiconductor layer including the region protruding outward from the first surface of the first semiconductor layer and the first surface of the first semiconductor layer face each other out of the surface of the first insulating layer (corresponding to the above-described "first region") and a region where the surface on the side of the first semiconductor layer and the first surface of the first semiconductor layer face each other out of the surface of the first electrode (corresponding to the above-described "second region") may be spaced apart in a direction parallel to the surface of the substrate.

The first electrode may be formed of a metal material including at least one of Ag and Al. These materials have high reflectance to light emitted from the active layer but are susceptible to migration. However, according to the above-described configuration, since the progress of the migration of the material forming the first electrode is suppressed, high reflectance may be maintained for a long time. As a result, the semiconductor light emitting element capable of maintaining high light extraction efficiency for a long period of time is realized.

The first insulating layer may be a layer provided to realize a function of the etching stopper. The first insulating layer may be configured to be in contact with the outer edge of the surface (first surface) on the side of the substrate of the first semiconductor layer.

The first semiconductor layer may be made a p-type semiconductor layer, and the second semiconductor layer may be made an n-type semiconductor layer.

The semiconductor light emitting element may include a first conductive layer in contact with the first surface in a third region interposed between the first region and the second region in the second direction, the first conductive layer formed of a material having higher contact resistance to the first surface as compared to the first electrode.

According to the above-described configuration, the first conductive layer is formed in a position between the first electrode and the first insulating layer in the direction (second direction) parallel to the surface of the substrate. The first conductive layer is formed of a material having contact resistance with the first semiconductor layer higher than that of the first electrode. At that time, the first conductive layer has charge of stronger same polarity (herein, "+") than the first electrode. As a result, even if the material forming the first electrode is ionized and the ions move due to an electric field between the first electrode and the second electrode, the presence of the first conductive layer formed between the first electrode and the first insulating layer limits the movement toward the first insulating layer. That is, according to the above-described configuration, the effect of suppressing the migration is further enhanced.

As an example of the first conductive layer, there may be a single-layer structure formed of Ti, TiW, Pt, Ni, W, Au and the like or a multi-layer structure of them.

The first conductive layer may be formed to connect a surface on a side of the substrate of the first electrode, a side surface of the first electrode, and the third region to one another.

The semiconductor light emitting element may include a bonding layer including a solder material formed on the upper side of the substrate; and a second conductive layer formed of a material different from the material of the first conductive layer, and formed so as to be in contact with a surface on a side opposite to the substrate of the bonding layer, a surface on a side of the substrate of the first conductive layer, and a surface on a side of the substrate of the first insulating layer.

The second conductive layer may be a layer provided for the purpose of suppressing diffusion of the material (solder material) included in the bonding layer on a side of the first electrode. For example, the second conductive layer may be made of Ti/Pt. On the other hand, the first conductive layer is formed of a material different from that of the second conductive layer, and may be made of, for example, TiW/Pt.

The first insulating layer may be formed so as to be in contact with a surface on a side of the substrate of the first conductive layer in a position facing the second electrode in the first direction.

According to this configuration, the first insulating layer not only serves as the etching stopper but also serves to spread the current flowing between the first electrode and the second electrode in the direction parallel to the surface of the substrate (second direction). That is, a light emitting region in the active layer is spread in the second direction. As a result, the semiconductor light emitting element is realized in which high light extraction efficiency is maintained for a long time.

Meanwhile, an insulating layer (second insulating layer) may be provided separately from the first insulating layer for spreading the current flowing between the first electrode and the second electrode in the direction (second direction) parallel to the surface of the substrate. That is, the semiconductor light emitting element may include the second insulating layer formed so as to be spaced apart from the first insulating layer in the second direction, the second insulating layer in contact with the surface on the side of the substrate of the first conductive layer in a position facing the second electrode in the first direction.

Also, the semiconductor light emitting element may include:
a bonding layer including a solder material formed on the upper side of the substrate;
a second conductive layer formed of a material different from the material of the first conductive layer so as to be in contact with a surface on a side opposite to the substrate of the bonding layer; and
a third conductive layer formed in a position interposed between the first conductive layer and the second conductive layer in the first direction and formed of a material different from the material of the first conductive layer and the second conductive layer,
in which the first conductive layer is formed to extend in the second direction so as to be in contact with the surface on a side of the substrate of the first insulating layer, and
the third conductive layer is formed in a region including a position facing the first insulating layer in the first direction.

The semiconductor light emitting element may include: a second insulating layer formed so as to be spaced apart from the first insulating layer in the second direction, the second insulating layer interposed between the third conductive layer and the second conductive layer in a position facing the second electrode in the first direction.

The semiconductor light emitting element may include: a bonding layer including a solder material formed on the upper side of the substrate, in which the first conductive layer may be formed so as to be in contact with a surface on a side opposite to the substrate of the bonding layer.

According to this configuration, it is possible to suppress the progress of the migration while reducing the number of layers to be deposited.

The semiconductor light emitting element may include:
a fourth conductive layer formed so as to be in contact with the first surface in a part of the third region, the fourth conductive layer interposed between the first conductive layer and the first insulating layer,
in which the fourth conductive layer may be formed of a material different from the material of the first conductive layer, the material having higher contact resistance to the first surface as compared to the first electrode.

The semiconductor light emitting element may include:
a bonding layer including a solder material formed on the upper side of the substrate,
in which the first conductive layer may be formed so as to be in contact with the first semiconductor layer in at least a partial region facing the first insulating layer in the first direction and to connect a side surface of the first electrode, the third region, and the first region.

The third region may face the second electrode in the first direction. In such a configuration also, the effect of spreading the current flowing in the active layer in the direction (second direction) parallel to the surface of the substrate is realized. Meanwhile, at that time, in the first conductive layer, Schottky contact with the first surface may be formed in the third region.

The third region may be located outside the second electrode as seen in the first direction.

As a result, a distance between the outer edge of the semiconductor light emitting element and the first electrode is secured to some extent. As a result, an amount of moisture penetrating the surface of the first electrode may be reduced. Furthermore, the time required for the ions of the material forming the first electrode to reach the outer edge of the semiconductor light emitting element by the migration may be further lengthened, which contributes to prolonging a lifetime.

Effect of the Invention

According to the present invention, a semiconductor light emitting element having a lifetime characteristic superior to that of the conventional one is realized.

MODE FOR CARRYING OUT THE INVENTION

Figure 1A:
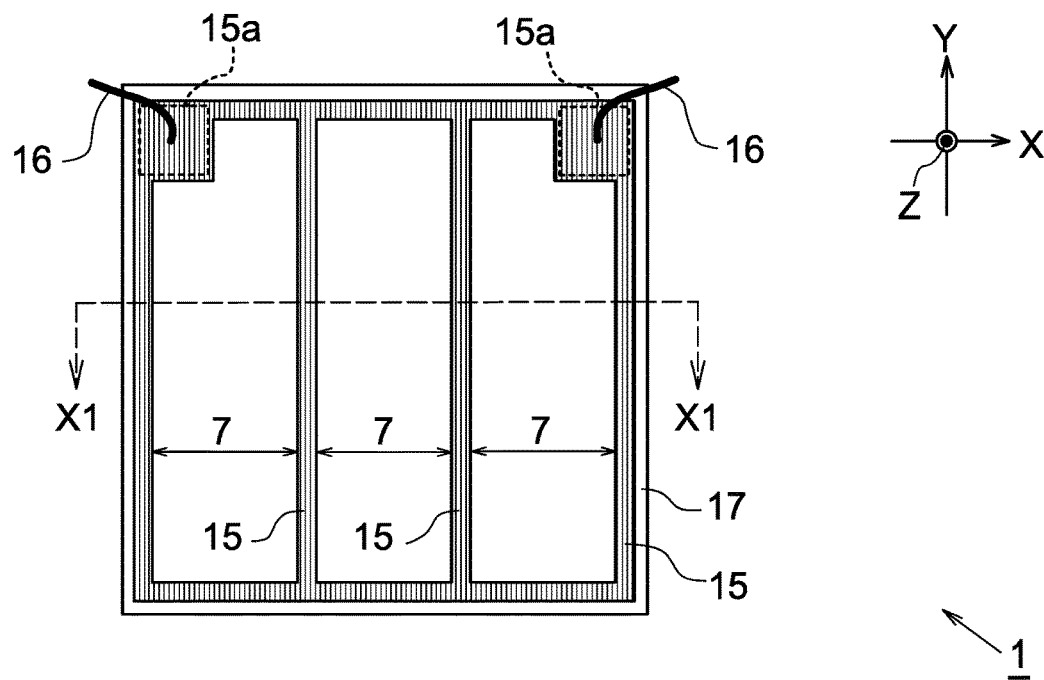
FIG. 1A is a plan view schematically illustrating a semiconductor light emitting element of a first embodiment.

A semiconductor light emitting element of the present invention is described with reference to the drawings. Meanwhile, in each drawing, a dimensional ratio in the drawing does not necessarily coincide with an actual dimensional ratio.

In this specification, the expression "a layer B is formed on the upper side of a layer A" means not only a case where the layer B is formed directly on a surface of the layer A but also a case where the layer B is formed on the surface of the layer A via a thin film. Meanwhile, the "thin film" herein may refer to a layer with a film thickness of 10 nm or less, and preferably 5 nm or less.

Hereinafter, the description "AlGaN" is synonymous with the description of $Al_mGa_{1-m}N$ (0<m<1) in which description of a composition ratio of Al and Ga is simply abbreviated; this is not intended to limit to a case where the composition ratio of Al and Ga is 1:1. The same applies to the description "InGaN".

First Embodiment

<Structure>

Figure 1B:
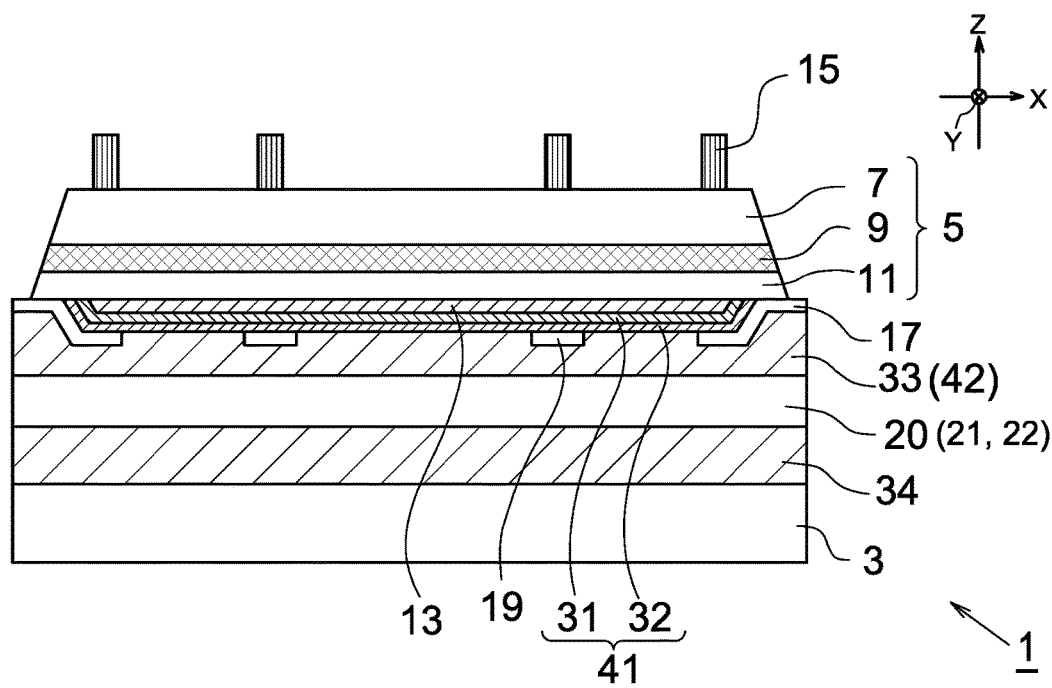
FIG. 1B is a cross-sectional view schematically illustrating the semiconductor light emitting element of the first embodiment.
Figure 1C:
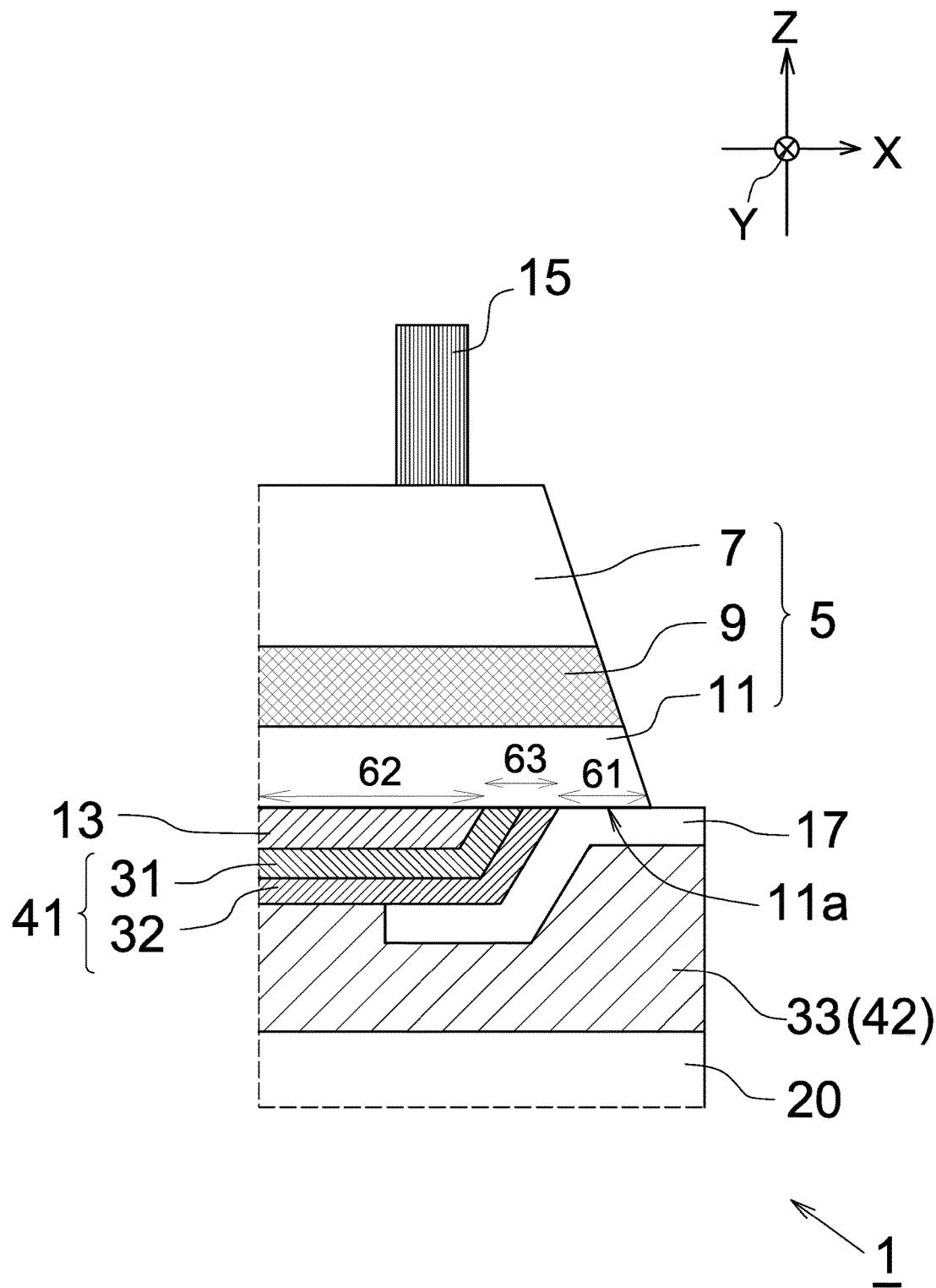
FIG. 1C is a partial enlarged view of FIG. 1B.

FIGS. 1A and 1B are views schematically illustrating a semiconductor light emitting element 1 of a first embodiment. FIG. 1A corresponds to a plan view when the semiconductor light emitting element 1 is seen from a light extraction surface. FIG. 1B corresponds to a cross-sectional view of the semiconductor light emitting element 1 taken along line X1-X1 in FIG. 1A. FIG. 1C is a partial enlarged view of FIG. 1B.

Hereinafter, as illustrated in FIG. 1A, the light extraction surface is defined as an X-Y plane, and a direction orthogonal to the X-Y plane is defined as a Z direction. In this embodiment, the Z direction corresponds to a "first direction", and a direction parallel to the X-Y plane corresponds to a "second direction". Also, the semiconductor light emitting element 1 is sometimes simply abbreviated as a "light emitting element 1" appropriately.

(Substrate 3)

The light emitting element 1 is provided with a substrate 3. The substrate 3 is formed of, for example, a conductive substrate of CuW, W, Mo or the like, or a semiconductor substrate of Si or the like.

(Semiconductor Layer 5)

The light emitting element 1 is provided with a semiconductor layer 5 formed on the upper side of the substrate 3. The semiconductor layer 5 is obtained by laminating a first semiconductor layer 11, an active layer 9, and a second semiconductor layer 7 in this order from a side closer to the substrate 3. In this embodiment, it is described assuming that the first semiconductor layer 11 is a p-type semiconductor layer and the second semiconductor layer 7 is an n-type semiconductor layer.

The first semiconductor layer 11 is formed of a nitride semiconductor layer doped with a p-type impurity such as Mg, Be, Zn, or C, for example. For example, GaN, AlGaN, AlInGaN or the like may be used as the nitride semiconductor layer.

The active layer 9 is formed of a semiconductor layer obtained by periodically repeating a light emitting layer made of InGaN and a barrier layer made of n-type AlGaN, for example. In this embodiment, the barrier layer is n-type, but this may be undoped or p-type doped. The active layer 9 may be obtained by laminating layers of at least two types of materials having different energy band gaps. A constituent material of the active layer 9 is appropriately selected according to a wavelength of light which is to be generated.

The second semiconductor layer 7 is formed of, for example, a nitride semiconductor layer doped with an n-type impurity such as Si, Ge, S, Se, Sn, or Te. For example, GaN, AlGaN, AlInGaN or the like may be used as the nitride semiconductor layer. Meanwhile, the second semiconductor layer 7 may also be made of a material different in composition from that of the p-type semiconductor layer 11.

(First electrode 13) The light emitting element 1 is provided with a first electrode 13. In this embodiment, the first electrode 13 is formed so as to be in contact with the first semiconductor layer 11. In more detail, as illustrated in FIG. 1C, first electrode 13 is formed so as to be in contact with a first surface 11a, which is the surface of the first semiconductor layer 11 on the side of substrate 3. In this embodiment, the first electrode 13 forms a p-side electrode.

In this embodiment, the first electrode 13 is made of a conductive material which exhibits high reflectance (for example, 80% or larger, more preferably 90% or larger) with respect to light emitted from the active layer 9. More specifically, this is made of, for example, Ag, Al, or a metal material including at least Ag or Al.

(Second Electrode 15)

The light emitting element 1 is provided with a second electrode 15. In this embodiment, the second electrode 15 is formed on an upper surface of the second semiconductor layer 7 and is made of, for example, Cr—Au. In this embodiment, the second electrode 15 forms an n-side electrode.

As illustrated in FIG. 1A, when the light emitting element 1 of this embodiment is seen from a side opposite to the substrate 3, that is, in a light extraction direction, the second electrode 15 is formed to enclose the light extraction surface formed of the second semiconductor layer 7. More specifically, the second electrode 15 is formed to extend in a predetermined direction at three sites spaced apart from one another. However, the extending number of the second electrode 15 is not limited to three, and may be four or larger. A shape of the second electrode 15 illustrated in FIG. 1A is merely an example, and may be appropriately changed according to a design.

Meanwhile, in an example illustrated in FIG. 1A, the second electrode 15 includes a wide region 15a as seen in the light extraction direction in a partial sites. The region 15a may form a pad electrode by a wire 16 made of, for example, Au, Cu or the like connected. At that time, the other end of the wire 16 may be connected to a power supply pattern of a package substrate or the like. Meanwhile, the second electrode 15 does not necessarily include the wide region 15a.

When a voltage is applied between the first electrode 13 and the second electrode 15, a current flows in the active layer 9, and the active layer 9 emits the light.

As described above, the first electrode 13 is made of a material which exhibits the high reflectance to the light generated in the active layer 9. It is assumed that the light emitting element 1 extracts the light emitted from the active layer 9 to a side of the second semiconductor layer 7. The first electrode 13 serves to enhance light extraction efficiency by reflecting the light emitted from the active layer 9 toward the substrate 3 toward the second semiconductor layer 7.

(First Insulating Layer 17)

The light emitting element 1 is provided with a first insulating layer 17. The first insulating layer 17 is made of, for example, $SiO_2$, SiN, $Zr_2O_3$, AlN, $Al_2O_3$ or the like.

As illustrated in FIGS. 1A and 1C, the first insulating layer 17 is formed so as to be in contact with an outer edge of the first surface 11a of the first semiconductor layer 11, and to protrude outward from the first surface 11a as seen in the Z direction (first direction). As is to be described later in a section of a manufacturing method, the first insulating layer 17 serves as an etching stopper at the time of element isolation.

As illustrated in FIG. 1C, a region (first region 61) where the first insulating layer 17 and the first surface 11a of the first semiconductor layer 11 are in contact with each other is separated from a region (second region 62) where the first electrode 13 and the first surface 11a of the first semiconductor layer 11 are in contact with each other in the X direction. In an example in FIG. 1C, the X direction corresponds to the "second direction".

Meanwhile, as illustrated in FIG. 1A, the first insulating layer 17 is formed to cover an outer periphery of the semiconductor layer 5 when the light emitting element 1 is seen in the Z direction. That is, in the light emitting element 1 of this embodiment, the region (first region 61) where the first insulating layer 17 and the first surface 11a of the first semiconductor layer 11 are in contact with each other and the region (second region 62) where the first electrode 13 and the first surface 11a of the first semiconductor layer 11 are in contact with each other may also be spaced apart in the Y direction. In this case, the Y direction corresponds to the "second direction".

That is, to summarize the description, in the light emitting element 1, the first region 61 and the second region 62 are spaced apart in the direction parallel to the X-Y plane (second direction). The same applies to the following embodiments.

(First Protective Layer 31, Second Protective Layer 32)

The light emitting element 1 includes a first protective layer 31 made of TiW and a second protective layer 32 made of Pt. The first protective layer 31 is formed on the lower side of the first electrode 13. The second protective layer 32 is formed on the lower side of the first protective layer 31. In the light emitting element 1 illustrated in FIGS. 1B and 1C, the first protective layer 31 and the second protective layer 32 correspond to a "first conductive layer 41".

As illustrated in FIG. 1C, in a third region 63 interposed between the first region 61 and the second region 62, the first conductive layer 41 is in contact with the first surface 11a of the first semiconductor layer 11. More specifically, the first conductive layer 41 is formed to connect a surface on a side of the substrate 3 of the first electrode 13, a side surface of the first electrode 13, and the third region 63.

In this embodiment, a part of the first insulating layer 17 is located on the lower side of the first conductive layer 41. More specifically, a part of the first insulating layer 17 is formed so as to be in contact with the first conductive layer 41 in a position facing the second electrode 15 in the Z direction. With such a configuration of the light emitting element 1, the current flowing in the active layer 9 is spread in the direction parallel to the X-Y plane also in a region near the outer edge of the light emitting element 1, so that the light emission efficiency is improved.

The first protective layer 31 may have a structure including Ni in an uppermost layer in order to improve adhesion.

(Second Insulating Layer 19)

As illustrated in FIG. 1B, in this embodiment, the light emitting element 1 is provided with a second insulating layer 19. The second insulating layer 19 is formed so as to be in contact with the first conductive layer 41 in a position facing the second electrode 15 in the Z direction. When the second insulating layer 19 is provided, the current flowing in the active layer 9 is spread in the direction parallel to the X-Y plane in a region nearer the center than the outer edge of the light emitting element 1, so that the light emission efficiency is improved.

The second insulating layer 19 is made of, for example, $SiO_2$, SiN, $Zr_2O_3$, AlN, $Al_2O_3$ and the like.

(Bonding Layer 20)

As illustrated in FIGS. 1B and 1C, in this embodiment, the light emitting element 1 is provided with a bonding layer 20. The bonding layer 20 includes, for example, a solder material of Au—Sn, Au—In, Au—Cu—Sn, Cu—Sn, Pd—Sn, Sn or the like. Meanwhile, the bonding layer 20 may also include the solder material and Ti layers provided so as to interpose them. As is to be described later, the bonding layer 20 is formed such that a bonding layer 21 formed on the upper side of the substrate 3 and a bonding layer 22 formed on the upper side of another substrate (a growth substrate 25 to be described later) face each other and are thereafter bonded to each other. Although FIG. 1B illustrates the bonding layers (21, 22) forming the integrated bonding layer 20, it is also possible that the bonding layers (21, 22) may be recognized in a laminated manner (Third Protective Layer 33)

In this embodiment, the light emitting element 1 is provided with a third protective layer 33. The third protective layer 33 has, for example, a multilayer structure including a laminate in which Ti/Pt is laminated by one cycle or multiple cycles and a laminate in which TiW/Pt is laminated by one cycle or multiple cycles. However, the third protective layer 33 may also be formed only of the laminate in which Ti/Pt is laminated by one cycle or multiple cycles or only of the laminate in which TiW/Pt is laminated by one cycle or multiple cycles. As illustrated in FIGS. 1B and 1C, the third protective layer 33 is formed on the lower side of the insulating layers (17, 19) and the first conductive layer 41. In more detail, the third protective layer 33 is formed so as to be in contact with a surface on a side opposite to the substrate 3 of the bonding layer 20, a surface on a side of the substrate 3 of the first conductive layer 41, and a surface on a side of the substrate 3 of the first insulating layer 17. In this embodiment, the third protective layer 33 forms a "second conductive layer 42".

The third protective layer 33 serves to prevent the material (solder material) included in the bonding layer 20 from diffusing to a side of the first electrode 13. If the solder material diffuses in the first electrode 13, the reflectance of the first electrode 13 decreases, and the light extraction efficiency decreases. By forming the third protective layer 33 between the bonding layer 20 and the first electrode 13, the decrease in reflectance of the first electrode 13 is suppressed.

The third protective layer 33 may also have a structure including Ni in the uppermost layer for the purpose of enhancing adhesion.

(Fourth Protective Layer 34)

In an example illustrated in FIG. 1B, the light emitting element 1 is provided with a fourth protective layer 34. As is the case with the third protective layer 33, the fourth protective layer 34 is provided for the purpose of suppressing the diffusion of the solder material included in the bonding layer 20. However, it is optional whether or not the light emitting element 1 is provided with the fourth protective layer 34.

<Action>

As described above with reference to FIG. 1C, according to the light emitting element 1, the region (first region 61) where the first surface 11a of the first semiconductor layer 11 and the first insulating layer 17 are in contact with each other and the region (second region 62) where the first surface 11a of the first semiconductor layer 11 and the first electrode 13 are in contact with each other are spaced apart from each other in the direction parallel to the X-Y plane. The first conductive layer 41 is in contact with the first surface 11a of the first semiconductor layer 11 in the region (third region 63) interposed between the first region 61 and the second region 62.

That is, on the first surface 11a of the first semiconductor layer 11, the first insulating layer 17 and the first electrode 13 are not in contact with each other. The first conductive layer 41 located in the third region 63 is a metal material and has a denser structure than that of the first insulating layer 17. Therefore, even if air penetrates the inside of the light emitting element 1 through the first insulating layer 17, the first conductive layer 41 prevents penetration of the air, so that an amount of air reaching the surface of the first electrode 13 decreases as compared with that in a conventional configuration. Therefore, as compared with the conventional configuration, progress of migration of the material (for example, Ag and Al) forming the first electrode 13 is suppressed, so that an element lifetime is improved.

Furthermore, TiW and Pt forming the first conductive layer 41 are materials having higher contact resistance with the first semiconductor layer 11 as compared with Ag and Al forming the first electrode 13. Therefore, even if the material forming the first electrode 13 is ionized, the metal ion is blocked by the material forming the first conductive layer 41 and is unlikely to reach the outer edge of the light emitting element 1. This further suppresses the progress of the migration as compared with the conventional configuration.

<Method of Manufacturing>

An example of a method of manufacturing the light emitting element 1 of this embodiment is described with reference to step cross-sectional views schematically illustrated in FIGS. 2A to 2G. Manufacturing conditions and dimensions such as a film thickness described below are merely examples.

(Step S1)

Figure 2A:
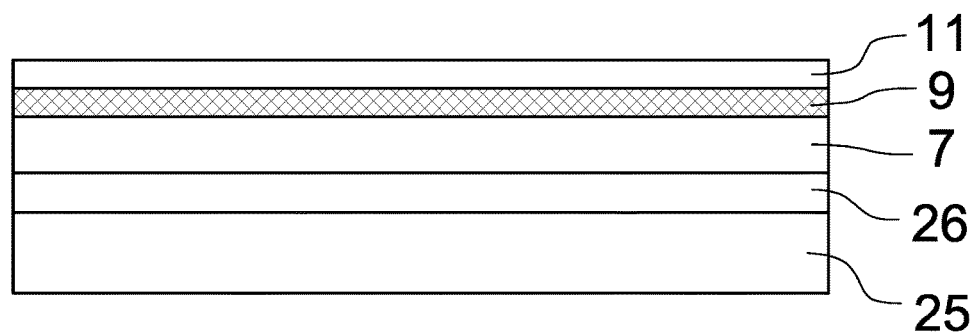
FIG. 2A is a part of a step cross-sectional view schematically illustrating a method of manufacturing the semiconductor light emitting element of the first embodiment.

First, the growth substrate 25 is prepared. Next, as illustrated in FIG. 2A, an undoped layer 26, the second semiconductor layer 7, the active layer 9, and the first semiconductor layer 11 are sequentially grown on the upper side of the growth substrate 25.

As a preparing step, the growth substrate 25 is cleaned. The cleaning is performed, for example, by increasing temperature in a furnace while allowing a hydrogen gas to flow at a predetermined flow rate in a state in which the growth substrate 25 is arranged in a processing furnace of a metal organic chemical vapor deposition (MOCVD) device.

Next, a low-temperature buffer layer of GaN is formed on an upper surface of the growth substrate 25, and an underlayer of GaN is formed above the same. The low-temperature buffer layer and underlayer correspond to the undoped layer 26.

As an example, a nitrogen gas and the hydrogen gas as carrier gases and trimethylgallium (TMG) and ammonia as source gases are supplied into the processing furnace at a predetermined flow rate for a predetermined time in a state in which a pressure in the furnace of the MOCVD device is set to approximately 100 kPa and the temperature in the furnace is set to approximately 480° C. As a result, the low-temperature buffer layer of GaN with a thickness of 20 nm, for example, is formed on the surface of the growth substrate 25.

Next, the temperature in the furnace of the MOCVD device is raised to, for example, 1150° C. Then, the nitrogen gas and the hydrogen gas as the carrier gas, and TMG and ammonia as the source gas are supplied into the processing furnace at a predetermined flow rate for a predetermined time. As a result, the underlayer made of GaN with a thickness of 1.7 µm, for example, is formed on the surface of the low-temperature buffer layer.

Next, for example, the nitrogen gas and the hydrogen gas as the carrier gases, and TMG, trimethylaluminum (TMA), ammonia, and tetraethylsilane as the source gases are supplied into the processing furnace at a predetermined flow rate for a predetermined time in a state in which the pressure in the furnace of the MOCVD device is set to 30 kPa and the temperature in the furnace is set to 1150° C. As a result, the second semiconductor layer 7 having a composition of, for example, n-$Al_{0.06}Ga_{0.94}N$ and a thickness of 2 µm is formed on the upper side of the undoped layer 26. Tetraethylsilane is an example of the source gas for doping Si as the n-type impurity.

Meanwhile, after that, an n-GaN layer may be formed on the upper side of the n-AlGaN layer by stopping the supply of TMA and supplying the other source gases for a predetermined time. In this case, the second semiconductor layer 7 includes the n-AlGaN layer and the n-GaN layer.

In the above description, although a case where the n-type impurity included in the second semiconductor layer 7 is Si is described, Ge, S, Se, Sn, Te or the like may be used as the n-type impurity in addition to Si. The source gas is appropriately selected according to dopant.

Next, for example, the nitrogen gas and the hydrogen gas as the carrier gases, and TMG, trimethylindium (TMI), and ammonia as the source gases are supplied into the processing furnace at a predetermined flow rate for a predetermined time in a state in which the pressure in the furnace of the MOCVD device is set to 100 kPa and the temperature in the furnace is set to 830° C. Thereafter, the flow rate is appropriately adjusted, and TMG, TMA, tetraethylsilane, and ammonia are supplied into the processing furnace for a predetermined time. Hereinafter, by repeating these processes, for example, the active layer 9 obtained by laminating the light emitting layers made of InGaN with a thickness of 2 nm and the barrier layers made of n-AlGaN with a thickness of 7 nm by 15 cycles is formed on the upper side of the second semiconductor layer 7.

Next, for example, in a state in which the pressure in the furnace of the MOCVD device is maintained at 100 kPa, the temperature in the furnace is raised to 1025° C. while allowing the nitrogen gas and the hydrogen gas as the carrier gases to flow. Then, TMG, TMA, ammonia, and biscyclopentadienyl magnesium (Cp$_2$Mg) as the source gases are supplied into the processing furnace at a predetermined flow rate for a predetermined time. As a result, for example, p-Al$_{0.3}$Ga$_{0.7}$N having a thickness of 20 nm is formed on the surface of the active layer 9. Thereafter, the flow rate of TMA is appropriately changed to form, for example, p-Al$_{0.13}$Ga$_{0.87}$N having a thickness of 120 nm. The first semiconductor layer 11 is made of these p-AlGaN.

Meanwhile, after this step, a p-GaN layer having a thickness of approximately 5 nm may be formed by stopping the supply of TMA and appropriately changing the flow rate of Cp$_2$Mg. In this case, the first semiconductor layer 11 includes the p-AlGaN layer and p-GaN layer.
(Step S3)

An activating process is performed on a wafer obtained at step S2. As a specific example, the activating process is performed at 650° C. for 15 minutes in a nitrogen atmosphere using a rapid thermal anneal (RTA) device.
(Step S4)

Figure 2B:
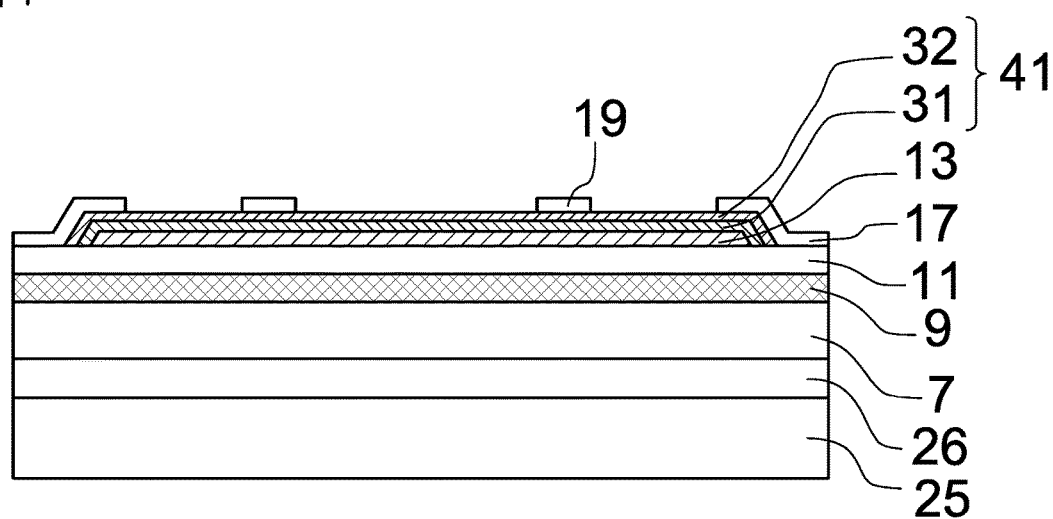
FIG. 2B is a part of the step cross-sectional view schematically illustrating the method of manufacturing the semiconductor light emitting element of the first embodiment.

As illustrated in FIG. 2B, the first electrode 13, the first protective layer 31, the second protective layer 32, the first insulating layer 17, and the second insulating layer 19 are formed on the upper side of the first semiconductor layer 11. An example of a specific method is as follows.

Constituent materials of the first electrode 13 are deposited in a predetermined region on an upper surface of the first semiconductor layer 11, more specifically, in a region except for the outer edge. As an example, Ag with a film thickness of approximately 150 nm is deposited by sputtering. As described above, Ag is an example of a material which exhibits the high reflectance (90% or larger) with respect to the light emitted from the active layer 9. In addition, in order to secure adhesion, a film made of another material such as Ni may be deposited on the upper side of Ag layer.

Next, after the first protective layer 31 made of TiW is formed by, for example, sputtering, the second protective layer 32 made of Pt is formed. At that time, in this embodiment, the first protective layer 31 and the second protective layer 32 are formed so as to be in contact with a part of the upper surface of the first semiconductor layer 11. An example of the film thickness of the first protective layer 31 is 60 nm, and an example of the film thickness of the second protective layer 32 is 60 nm.

After that, a contact annealing process is performed, for example, at 400 to 550° C. for 60 to 300 seconds in a dry air or inert gas atmosphere using the RTA device or the like. As a result, the first electrode 13 in ohmic contact with the first semiconductor layer 11 is formed.

Next, the first insulating layer 17 is formed so as to connect the upper surface of the first semiconductor layer 11 exposed at the outer edge and a part of an upper surface of the second protective layer 32, and the second insulating layer 19 is formed on the upper surface of a part of the second protective layer 32. In a case where the first insulating layer 17 and the second insulating layer 19 are made of the same material, both the insulating layers (17, 19) may be simultaneously deposited. As an example, after SiO$_2$ is deposited to a film thickness of approximately 50 nm by plasma CVD method, this is patterned by etching, so that the insulating layers (17, 19) are formed. Meanwhile, it is sufficient that the material to be deposited is an insulating material, and this may be SiN or Al$_2$O$_3$ in addition to SiO$_2$.
(Step S5)

Figure 2C:
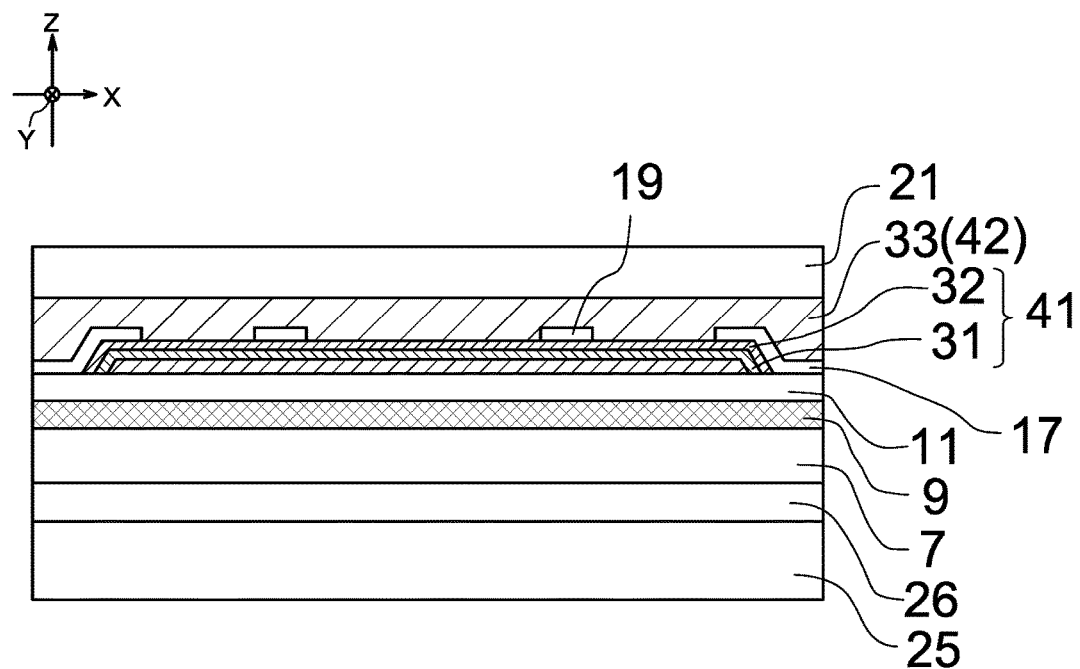
FIG. 2C is a part of the step cross-sectional view schematically illustrating the method of manufacturing the semiconductor light emitting element of the first embodiment.

As illustrated in FIG. 2C, the third protective layer 33 is formed to cover upper surfaces of the insulating layers (17, 19), and then the bonding layer 21 is formed on an upper surface of the third protective layer 33.

As an example, the third protective layer 33 is formed by depositing Ti with a film thickness of 200 nm and Pt with a film thickness of 50 nm by three cycles by sputtering. As another example, after depositing Ti with a film thickness of 50 nm and Pt with a film thickness of 200 nm, TiW with a film thickness of 200 nm and Pt with a film thickness of 50 nm are deposited by two cycles, thereby forming the third protective layer 33. Meanwhile, Ni with a film thickness of approximately 100 nm may be deposited on an uppermost surface of the third protective layer 33. Next, for example, Ti with a film thickness of 300 nm is vapor-deposited, and then Au—Sn solder made of 80% of Au and 20% of Su is vapor-deposited to a film thickness of 3 μm, so that the bonding layer 21 is formed.
(Step S6)

Figure 2D:
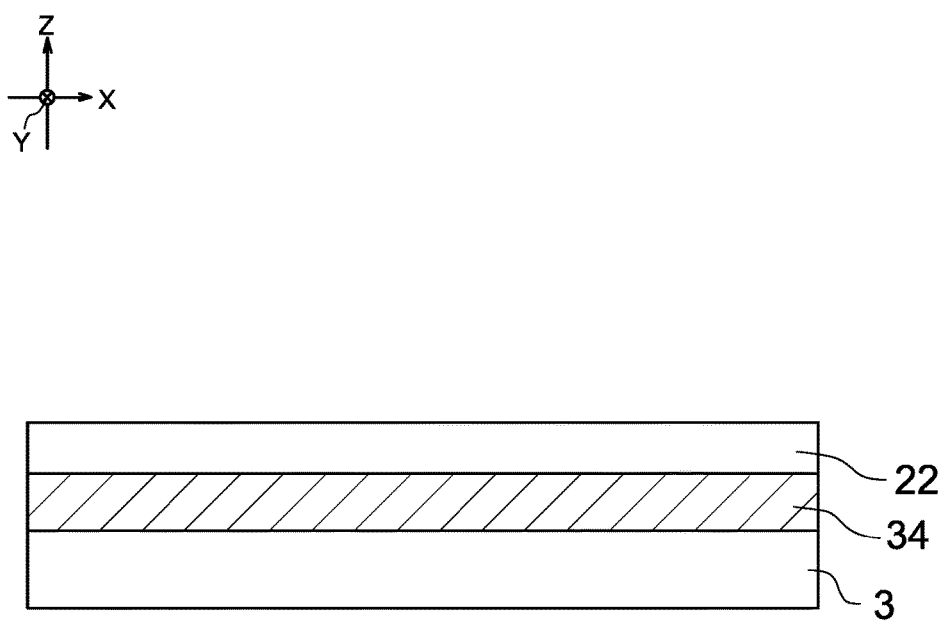
FIG. 2D is a part of the step cross-sectional view schematically illustrating the method of manufacturing the semiconductor light emitting element of the first embodiment.

As illustrated in FIG. 2D, the fourth protective layer 34 and the bonding layer 22 are formed on an upper surface of the substrate 3 prepared separately from the growth substrate 25 in a manner similar to that at step S5. As the substrate 3, as described above, the conductive substrate of CuW, W, Mo or the like, or the semiconductor substrate of Si or the like may be used. Meanwhile, it is also possible that the fourth protective layer 34 is not formed.
(Step S7)

Figure 2E:
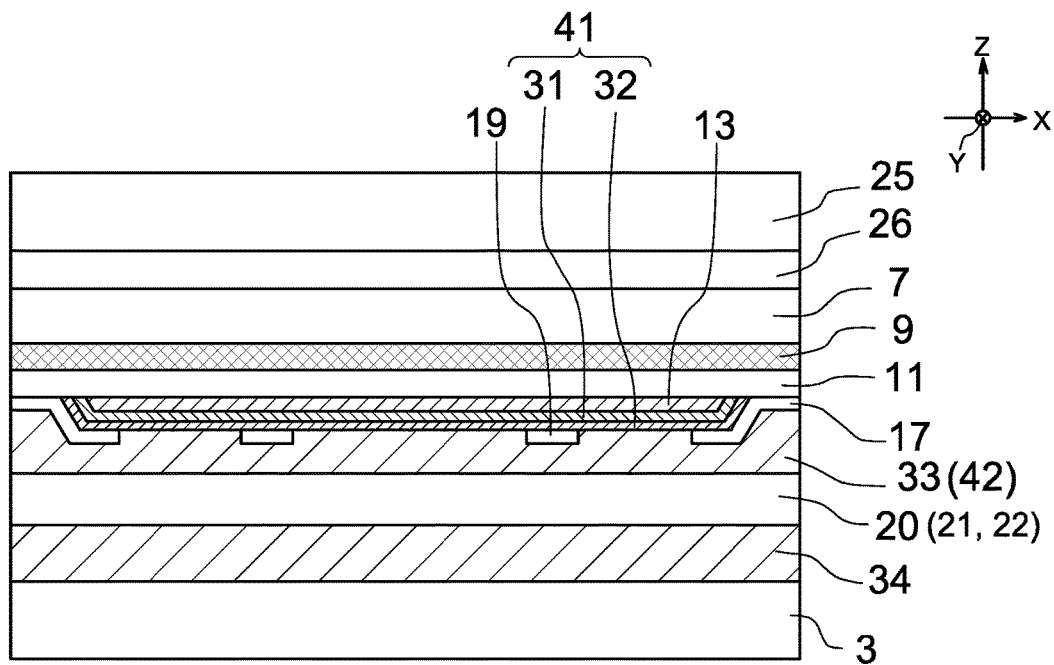
FIG. 2E is a part of the step cross-sectional view schematically illustrating the method of manufacturing the semiconductor light emitting element of the first embodiment.

As illustrated in FIG. 2E, by bonding the bonding layer 21 formed on the upper side of the growth substrate 25 and the bonding layer 22 formed on the upper side of the substrate 3, the growth substrate 25 and the substrate 3 are bonded to each other. As a specific example, a bonding process is performed at temperature of 280° C. under a pressure of 0.2 MPa.

At this step, the bonding layer 21 and the bonding layer 22 are melted and bonded to form a structure in which the substrate 3 and the growth substrate 25 are bonded on front and rear surfaces. That is, the bonding layer 21 and the bonding layer 22 may form the integrated bonding layer 20 after this step. Then, the protective layers (33, 34) are formed before the execution of this step S7, so that the diffusion of the constituent materials (more specifically, the solder materials) of the bonding layers (21, 22) is suppressed.
(Step S8)

Figure 2F:
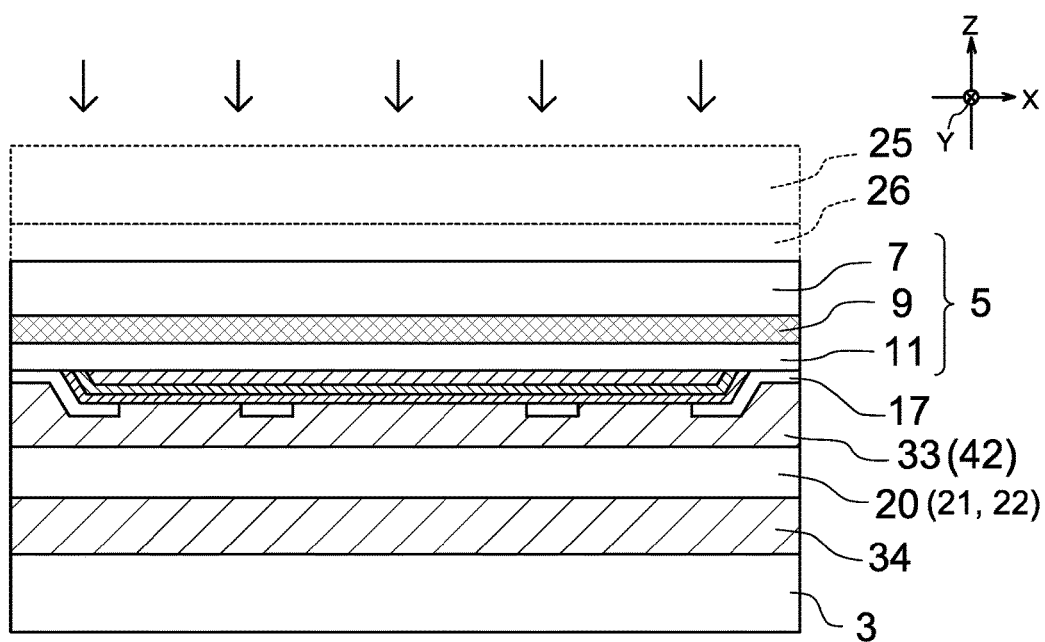
FIG. 2F is a part of the step cross-sectional view schematically illustrating the method of manufacturing the semiconductor light emitting element of the first embodiment.

Next, as illustrated in FIG. 2F, the growth substrate 25 is peeled off. More specifically, in a state in which the growth substrate 25 faces upward and the substrate 3 faces downward, laser light is emitted from a side of the growth substrate 25. Herein, the emitted laser light is made light of a wavelength which transmits the constituent material of the growth substrate 25 (sapphire in this embodiment) and is absorbed by the constituent material of the undoped layer 26 (GaN in this embodiment). As a result, the laser light is absorbed by the undoped layer 26, so that temperature of an interface between the growth substrate 25 and the undoped layer 26 is increased to decompose GaN, and the growth substrate 25 is peeled off.

Thereafter, the second semiconductor layer 7 is exposed by removing GaN (undoped layer 26) remaining on the wafer by wet etching using hydrochloric acid or the like or dry etching using an ICP device. At this step S8, the undoped layer 26 is removed, and the semiconductor layer 5 in which the first semiconductor layer 11, the active layer 9, and the second semiconductor layer 7 are laminated in this order from the side of the substrate 3 remains.
(Step S9)

Figure 2G:
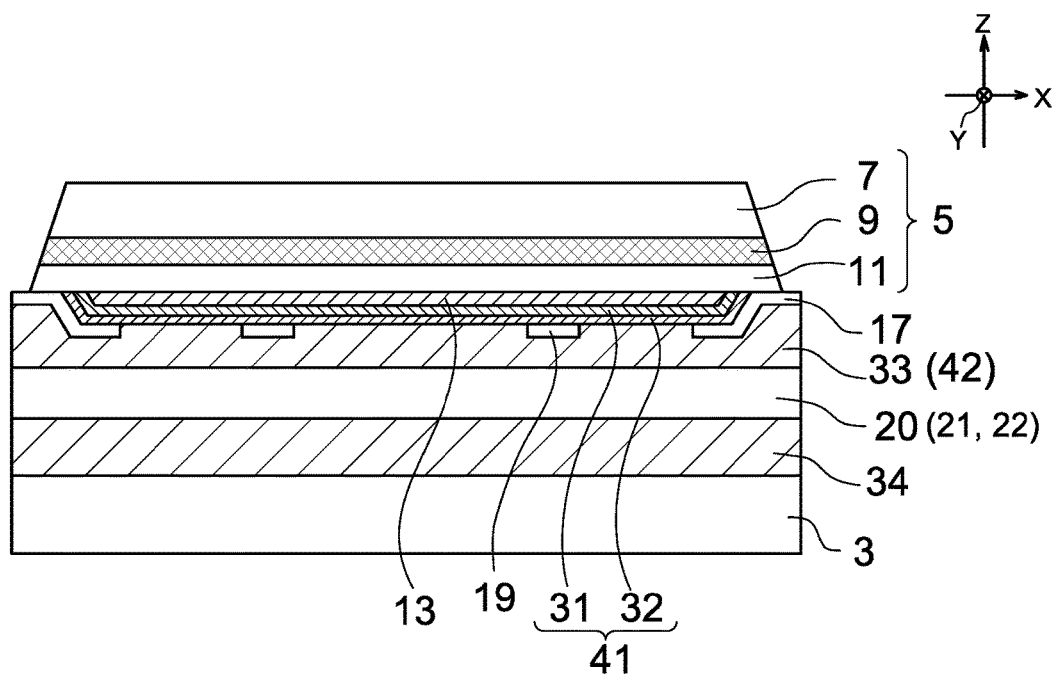
FIG. 2G is a part of the step cross-sectional view schematically illustrating the method of manufacturing the semiconductor light emitting element of the first embodiment.

Next, as illustrated in FIG. 2G, adjacent elements are separated. Specifically, the semiconductor layer 5 is etched until the upper surface of the first insulating layer 17 is exposed using the ICP device in a boundary region with the adjacent element. At that time, as described above, the first insulating layer 17 serves as the etching stopper.

Meanwhile, in FIG. 2G, it is illustrated that a side surface of the semiconductor layer 5 is inclined with respect to a vertical direction, but this is merely an example, and it is not intended to limit to such a shape.
(Step S10)

Next, as illustrated in FIG. 1B, the second electrode 15 is formed in a predetermined region of the upper surface of the second semiconductor layer 7, more specifically, in a partial region facing the insulating layers (17, 19) in the Z direction of the upper surface of the second semiconductor layer 7. As an example of a specific method, Cr with a film thickness of 100 nm and Au with a film thickness of 3 µm are vapor-deposited on the upper surface of the second semiconductor layer 7 in a state in which a region other than the region on which the second electrode 15 is to be formed on the upper surface of the second semiconductor layer 7 is masked with a resist or the like. Thereafter, after the mask is peeled off, the annealing process is performed at 250° C. for approximately one minute in the nitrogen atmosphere.
(Step S11)

Next, the elements are separated by, for example, a laser dicing device. Thereafter, a rear surface of the substrate 3 is bonded to a package by, for example, Ag paste. Thereafter, wire bonding is performed on a partial region of the second electrode 15. The light emitting element 1 is manufactured through above-described steps.

Meanwhile, after step S9 or after step S10, a step of forming minute unevenness on the upper surface of the second semiconductor layer 7 by wet etching may be executed. The unevenness is provided for the purpose of improving the light extraction efficiency. Also, after that, the upper surface of the second semiconductor layer 7 and the side surface of the semiconductor layer 5 which are exposed may be covered with a passivation film made of an insulating material such as $SiO_2$.

<Another Configuration Example>

Figure 3A:
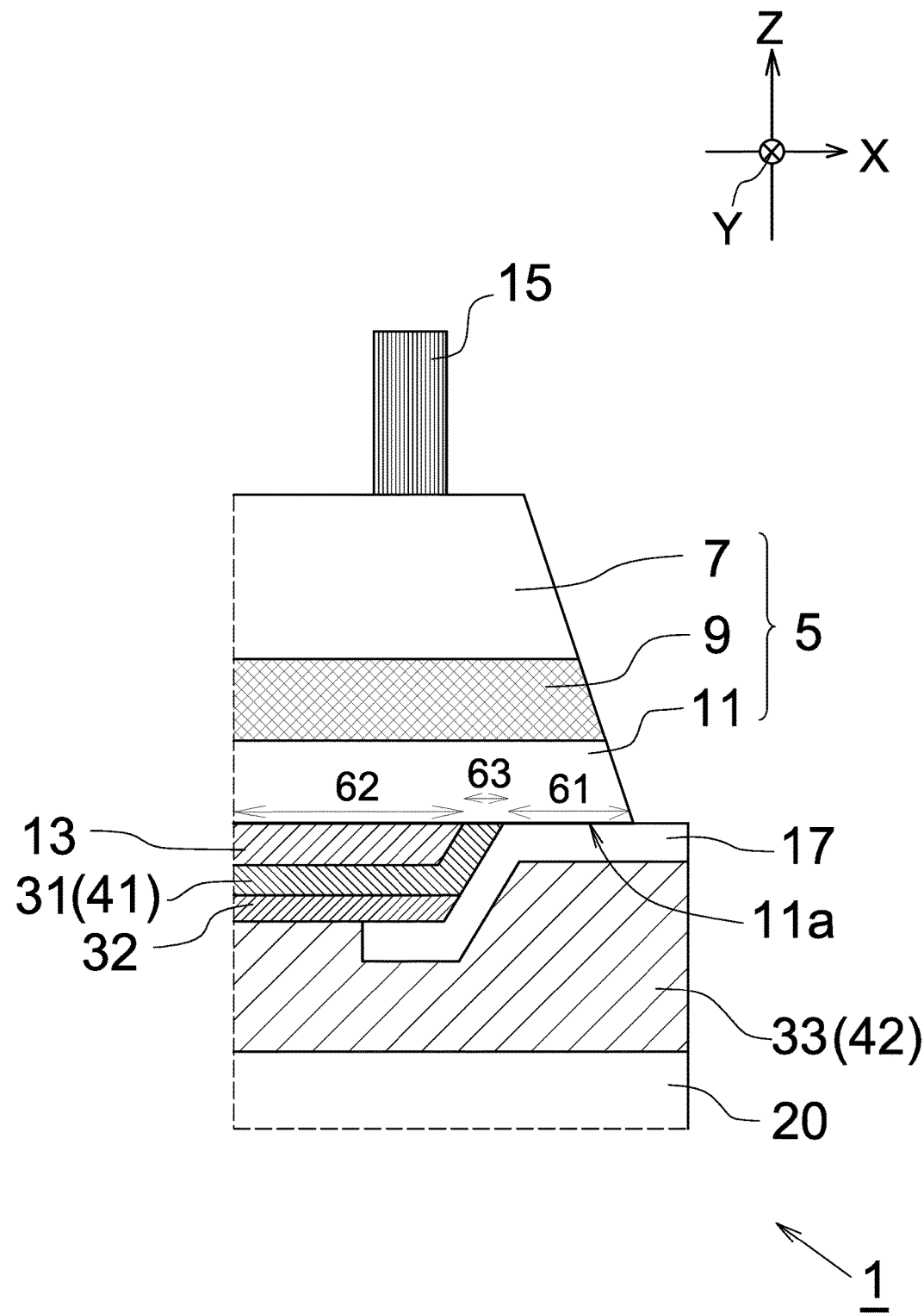
FIG. 3A is a partial enlarged cross-sectional view schematically illustrating another configuration example of the semiconductor light emitting element of the first embodiment.

As illustrated in FIG. 3A, it is also possible to configure such that the first protective layer 31 is in contact with the first semiconductor layer 11 and the second protective layer 32 is not in contact with the first semiconductor layer 11 in the third region 63. In this configuration, the first protective layer 31 corresponds to the "first conductive layer 41".

Figure 3B:
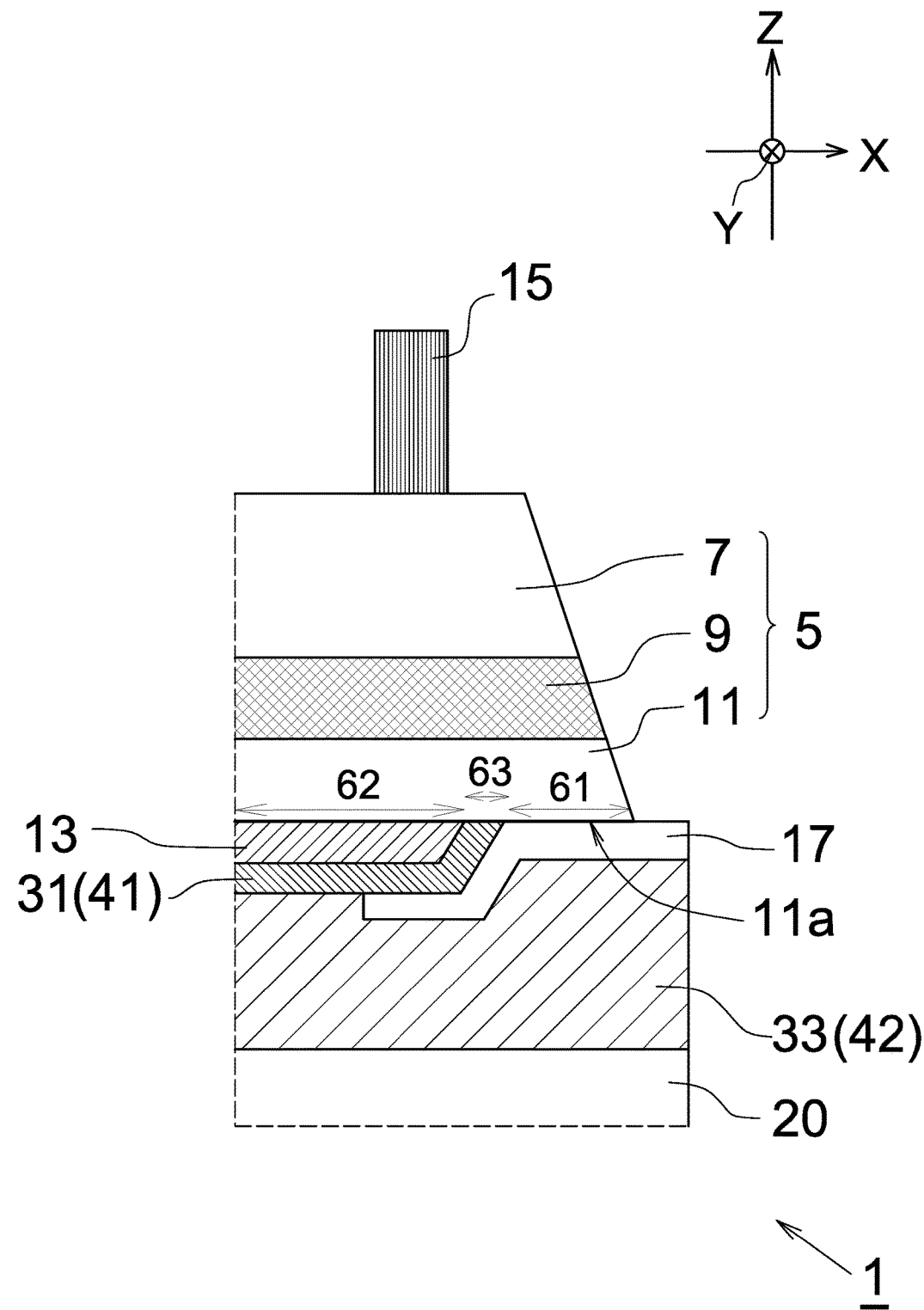
FIG. 3B is a partial enlarged cross-sectional view schematically illustrating another configuration example of the semiconductor light emitting element of the first embodiment.

Furthermore, as illustrated in FIG. 3B, it is also possible that the light emitting element 1 is not provided with the second protective layer 32. Also in this configuration, the first protective layer 31 corresponds to the "first conductive layer 41".

Second Embodiment

Figure 4A:
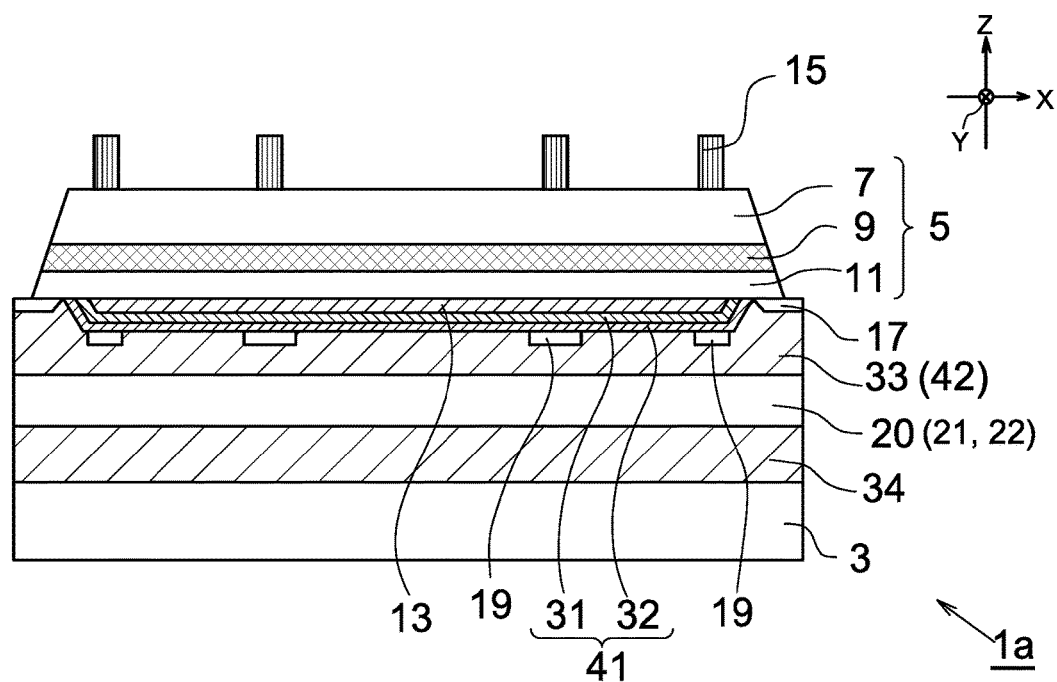
FIG. 4A is a cross-sectional view schematically illustrating a semiconductor light emitting element of a second embodiment.
Figure 4B:
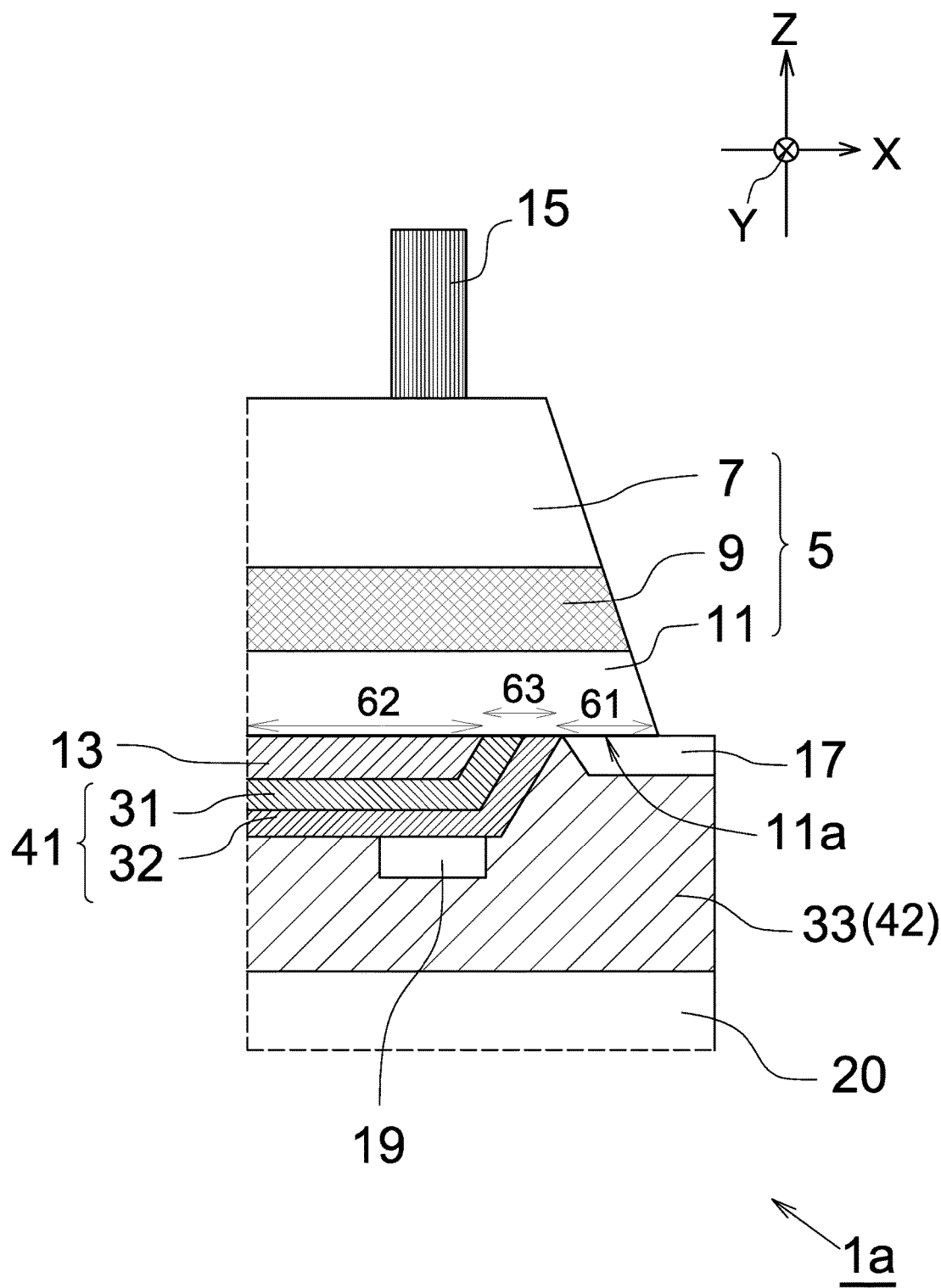
FIG. 4B is a partial enlarged view of FIG. 4A.

In the second embodiment of the present invention, a portion different from that of the first embodiment is described. FIG. 4A is a view schematically illustrating a semiconductor light emitting element 1a of the second embodiment. FIG. 4B is a partial enlarged view of FIG. 4A. Meanwhile, in each of the following embodiments, the plan view is common to that of the semiconductor light emitting element 1 of the first embodiment, so that they are omitted.

The light emitting element 1a of this embodiment differs from the light emitting element 1 of the first embodiment in a region in which a first insulating layer 17 is formed. That is, unlike the first embodiment, the first insulating layer 17 is not in contact with a bottom surface of a first conductive layer 41. A second insulating layer 19 in contact with the bottom surface of the first conductive layer 41 is formed independently of the first insulating layer 17 in a position facing a second electrode 15 in a Z direction. In a third region 63, the first conductive layer 41 and a third protective layer 33 are in contact with a first semiconductor layer 11.

Even with such a configuration, since the first insulating layer 17 and a first electrode 13 are not in contact with each other on a first surface 11a of the first semiconductor layer 11, progress of migration of a material (for example, Ag, Al) forming the first electrode 13 is suppressed as compared to that in a conventional configuration, so that a lifetime is improved. When manufacturing the light emitting element 1a, at step S4, formation sites of the first insulating layer 17 and the second insulating layer 19 may be changed according to a configuration of the light emitting element 1a.

Figure 5:
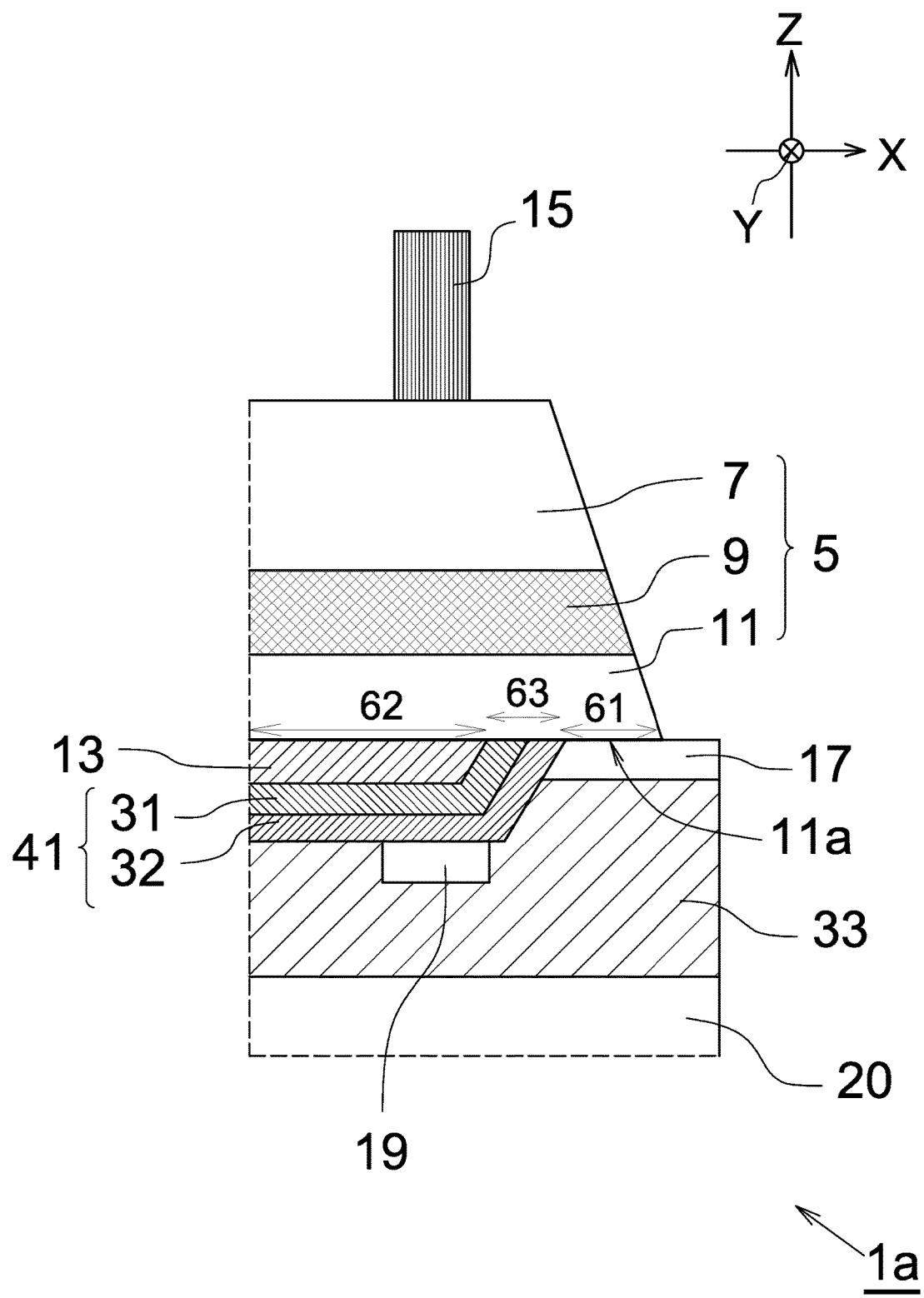
FIG. 5 is a partial enlarged cross-sectional view schematically illustrating another configuration example of the semiconductor light emitting element of the second embodiment.

Meanwhile, as a variation of the light emitting element 1a, as illustrated in FIG. 5, it is also possible to configure such that the third protective layer 33 is not in contact with the first surface 11a in the third region 63 by bringing a side surface of the first insulating layer 17 into contact with a side surface of the first conductive layer 41. Also, as in the configuration illustrated in FIG. 3A, it is also possible to configure such that the second protective layer 32 is not in contact with the first semiconductor layer 11 in the third region 63. Also, as in the configuration illustrated in FIG. 3B, it is also possible that the second protective layer 32 is not provided.

Third Embodiment

Figure 6A:
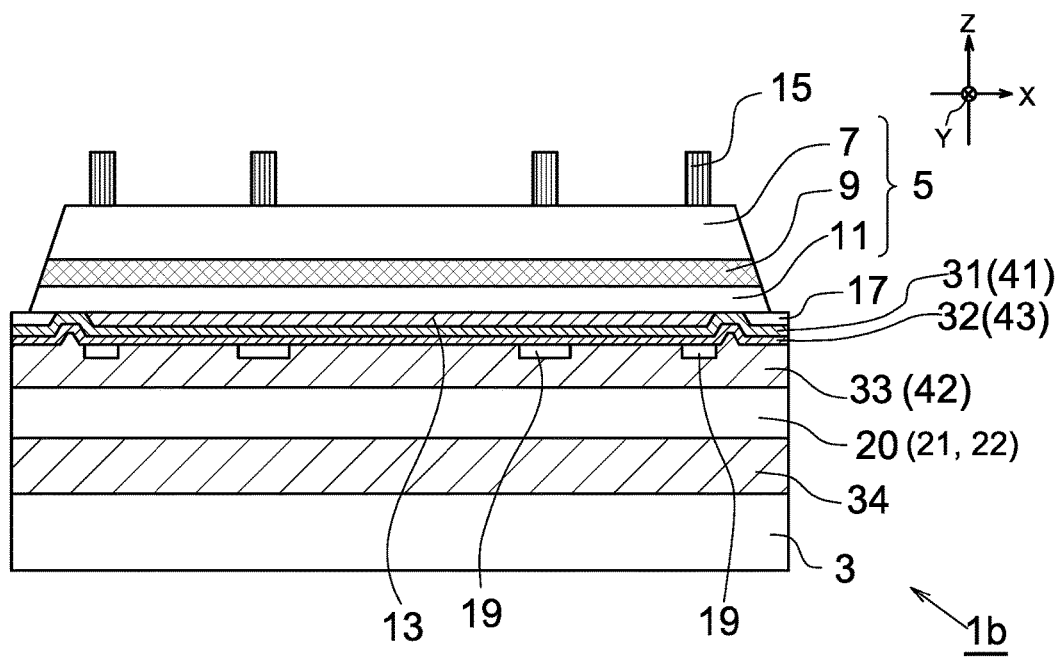
FIG. 6A is a cross-sectional view schematically illustrating a semiconductor light emitting element of a third embodiment.
Figure 6B:
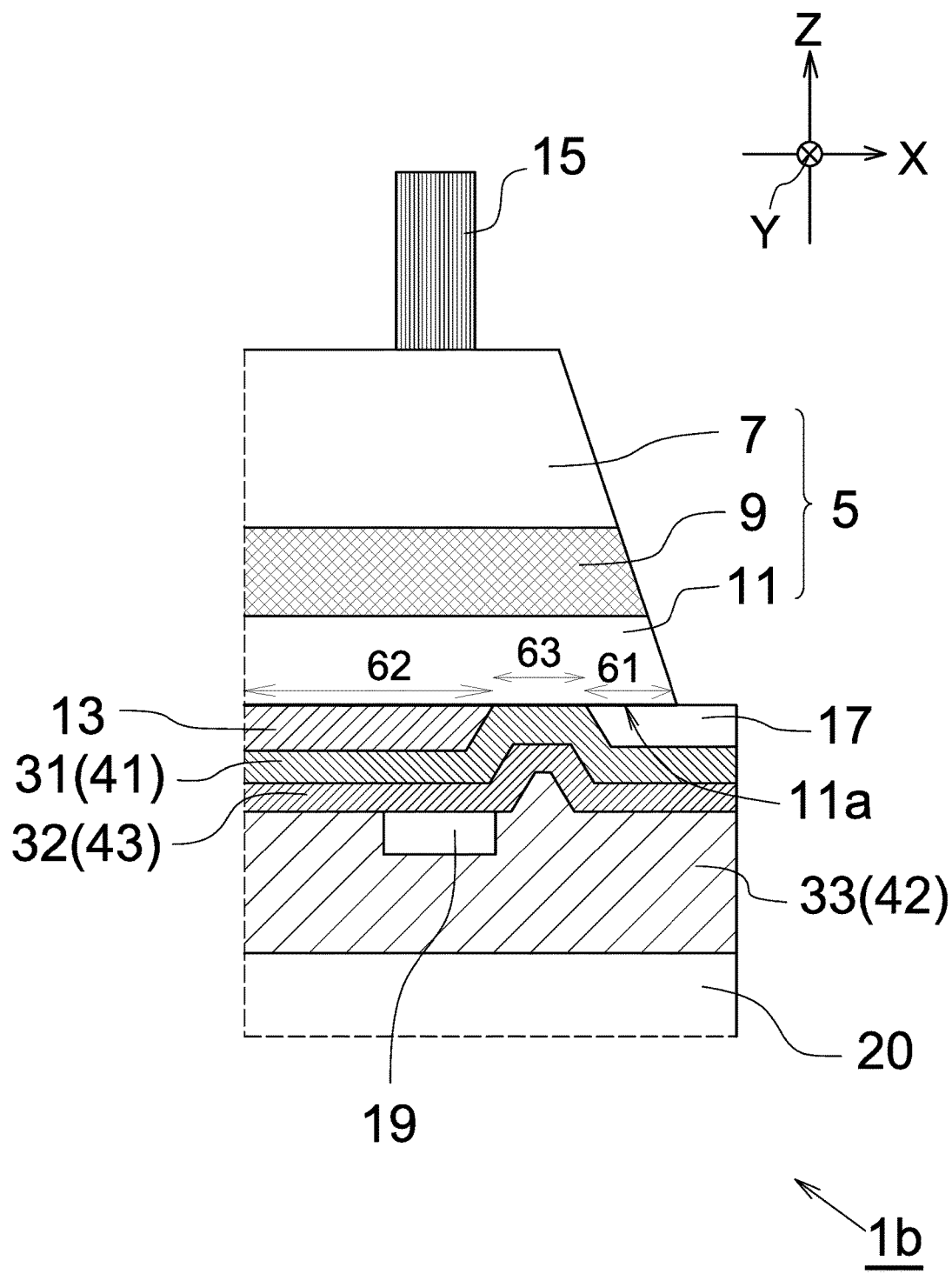
FIG. 6B is a partial enlarged view of FIG. 6A.

In a third embodiment of the present invention, a portion different from that of the second embodiment is described. FIG. 6A is a view schematically illustrating a semiconductor light emitting element 1b of the third embodiment. FIG. 6B is a partial enlarged view of FIG. 6A.

The light emitting element 1b of this embodiment differs from the light emitting element 1a of the second embodiment in regions in which the first protective layer 31 and the second protective layer 32 are formed. The first protective layer 31 is formed so as to be in contact with a surface on a side of a substrate 3 of a first electrode 13, a first surface 11a of a first semiconductor layer 11, and a surface on a side of the substrate 3 of a first insulating layer 17. The second protective layer 32 is formed so as to be in contact with a surface on a side of the substrate 3 of the first protective layer 31 and a surface opposite to the substrate 3 of a third protective layer 33. The second protective layer 32 is formed so as to be in contact with the first protective layer 31 also in a position facing the first insulating layer 17 in a Z direction.

In this embodiment, the first protective layer 31 corresponds to the "first conductive layer 41", the third protective layer 33 corresponds to a "second conductive layer 42", and the second protective layer 32 corresponds to a "third conductive layer 43".

Even with such a configuration, since the first insulating layer 17 and a first electrode 13 are not in contact with each other on a first surface 11a of the first semiconductor layer 11, progress of migration of a material (for example, Ag, Al) forming the first electrode 13 is suppressed as compared to that in a conventional configuration, so that a lifetime is improved. When manufacturing the light emitting element 1b, at step S4, sites in which the first insulating layer 17, the second insulating layer 19, the first protective layer 31, and the second protective layer 32 are formed may be changed according to the configuration of the light emitting element 1b.

Fourth Embodiment

Figure 7A:
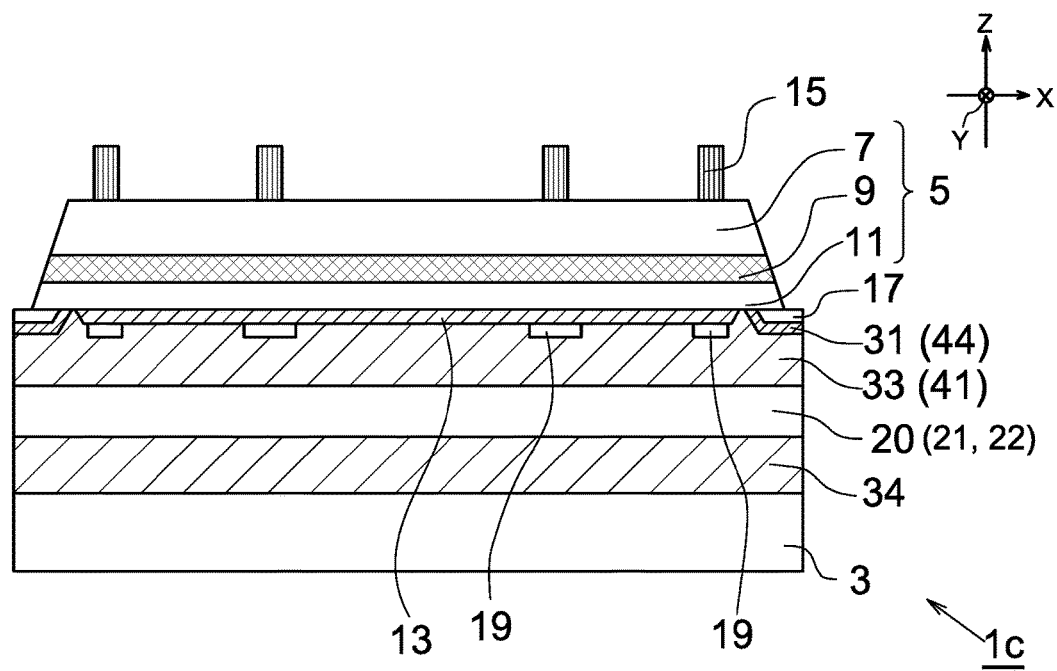
FIG. 7A is a cross-sectional view schematically illustrating a semiconductor light emitting element of a fourth embodiment.
Figure 7B:
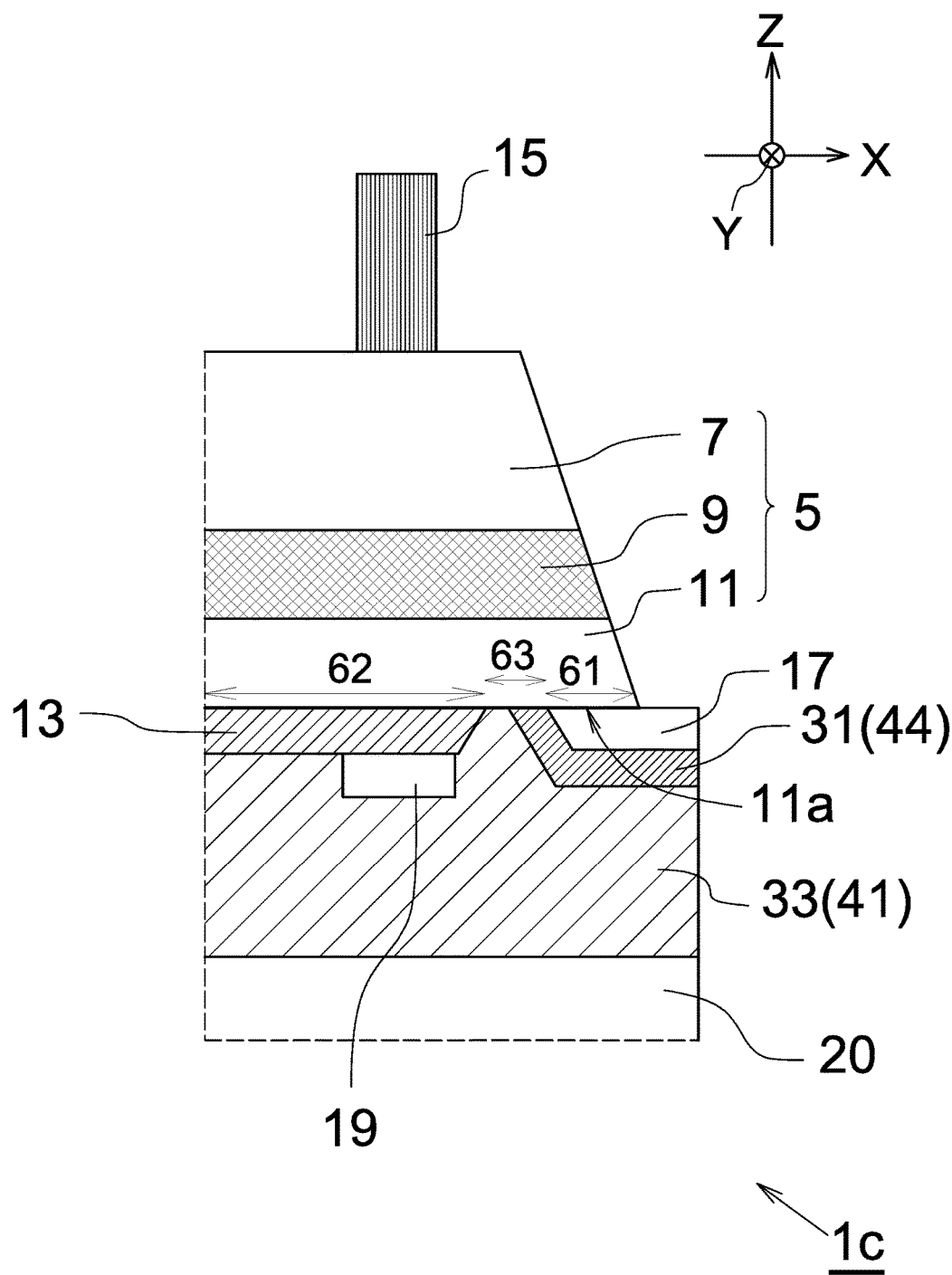
FIG. 7B is a partial enlarged view of FIG. 7A.

In a fourth embodiment of the present invention, a portion different from that of the third embodiment is described. FIG. 7A is a view schematically illustrating a semiconductor light emitting element 1c of the fourth embodiment. FIG. 7B is a partial enlarged view of FIG. 7A.

The light emitting element 1c of this embodiment differs from the light emitting element 1b of the third embodiment in a region in which a first protective layer 31 is formed. The first protective layer 31 is formed so as not to be in contact with a surface on a side of a substrate 3 of a first electrode 13 and to be in contact with a first surface 11a of a first semiconductor layer 11 and a surface on a side of the substrate 3 of a first insulating layer 17. In addition, the light emitting element 1c is not provided with a second protective layer 32.

In the light emitting element 1c, the first protective layer 31 and a third protective layer 33 are in contact with the first semiconductor layer 11 in a third region 63. In this embodiment, the third protective layer 33 corresponds to a "first conductive layer 41", and the first protective layer 31 corresponds to a "fourth conductive layer 44".

Even with such a configuration, since the first insulating layer 17 and a first electrode 13 are not in contact with each other on a first surface 11a of the first semiconductor layer 11, progress of migration of a material (for example, Ag, Al) forming the first electrode 13 is suppressed as compared to that in a conventional configuration, so that a lifetime is improved. When manufacturing the light emitting element 1c, at step S4, sites in which the first insulating layer 17, a second insulating layer 19, and the first protective layer 31 are formed may be changed according to the configuration of the light emitting element 1c.

Fifth Embodiment

In a fifth embodiment of the present invention, a part different from that in the fourth embodiment is described.

Figure 8A:
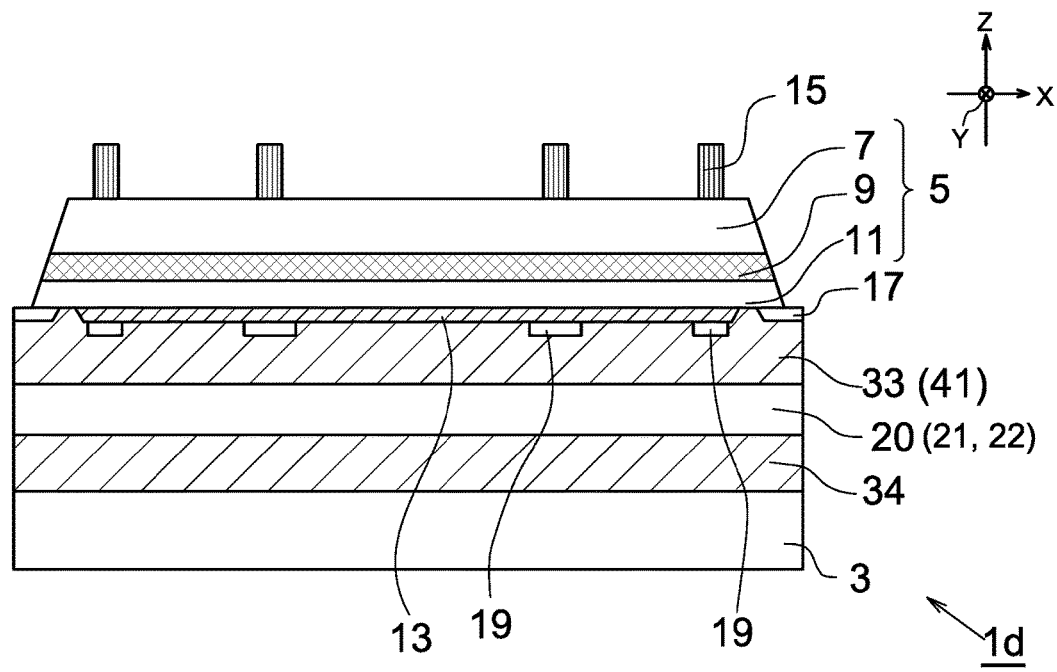
FIG. 8A is a cross-sectional view schematically illustrating a semiconductor light emitting element of a fifth embodiment.
Figure 8B:
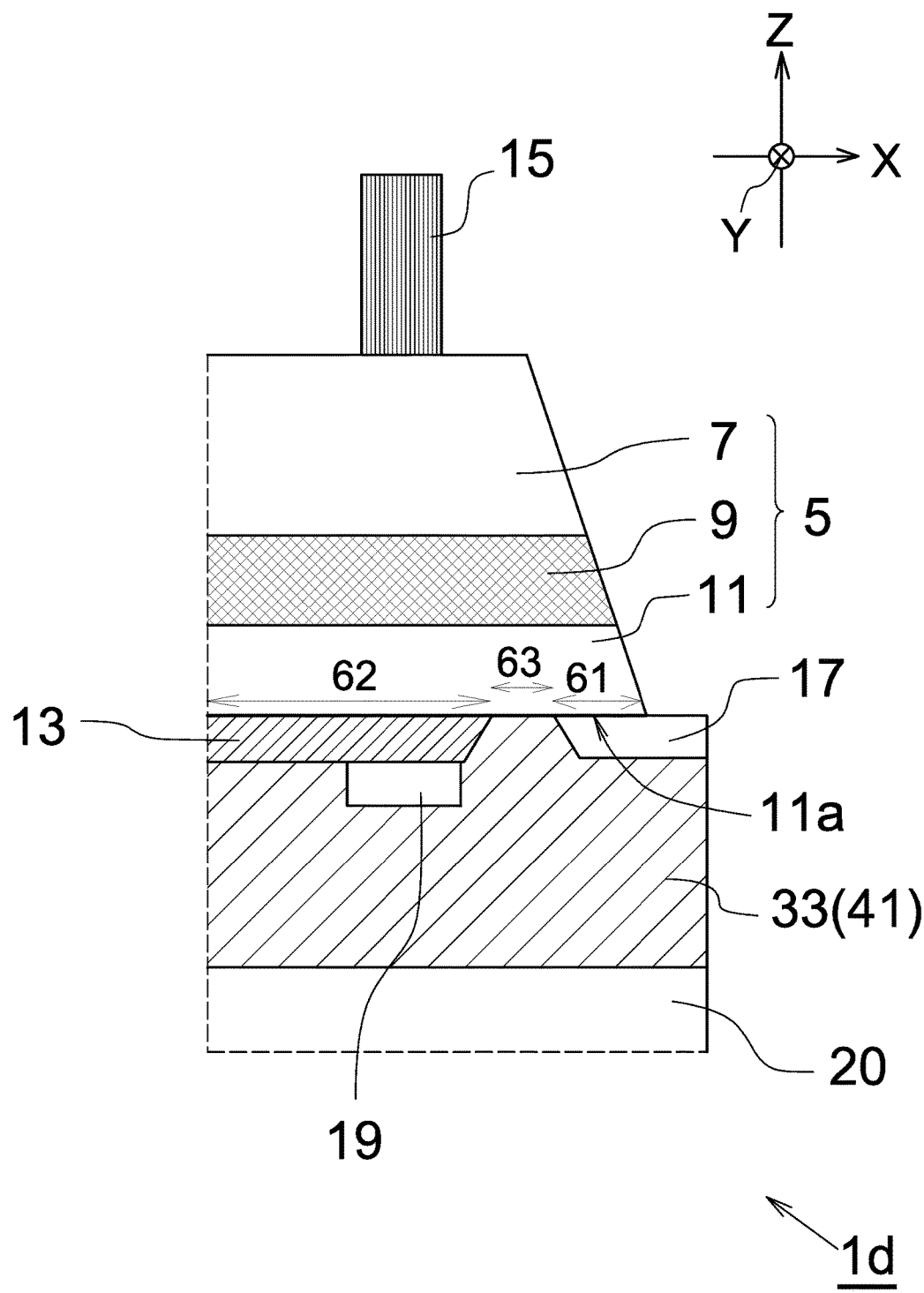
FIG. 8B is a partial enlarged view of FIG. 8A.

FIG. 8A is a view schematically illustrating a semiconductor light emitting element 1d of the fifth embodiment. FIG. 8B is a partial enlarged view of FIG. 8A.

The light emitting element 1d of this embodiment differs from the light emitting element 1c of the fourth embodiment in that a first protective layer 31 is not provided. That is, as illustrated in FIG. 8B, a third protective layer 33 is in contact with a first semiconductor layer 11 in a third region 63. The third protective layer 33 is also in contact with a side surface of a first electrode 13 and a side surface of a first insulating layer 17. In this embodiment, the third protective layer 33 corresponds to a "first conductive layer 41".

Even with such a configuration, since the first insulating layer 17 and a first electrode 13 are not in contact with each other on a first surface 11a of the first semiconductor layer 11, progress of migration of a material (for example, Ag, Al) forming the first electrode 13 is suppressed as compared to that in a conventional configuration, so that a lifetime is improved. When manufacturing the light emitting element 1d, a depositing step of the first protective layer 31 may be omitted at step S4 as compared with the method of manufacturing the light emitting element 1c of the third embodiment.

<Another Configuration Example>

Figure 8C:
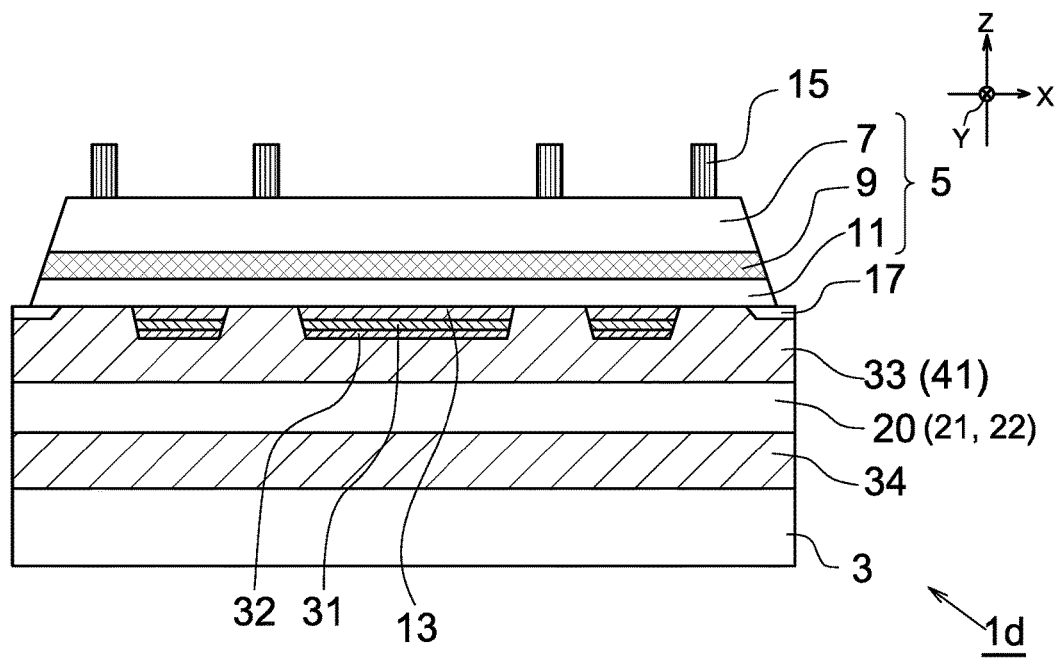
FIG. 8C is a cross-sectional view schematically illustrating another configuration example of the semiconductor light emitting element of the fifth embodiment.
Figure 8D:
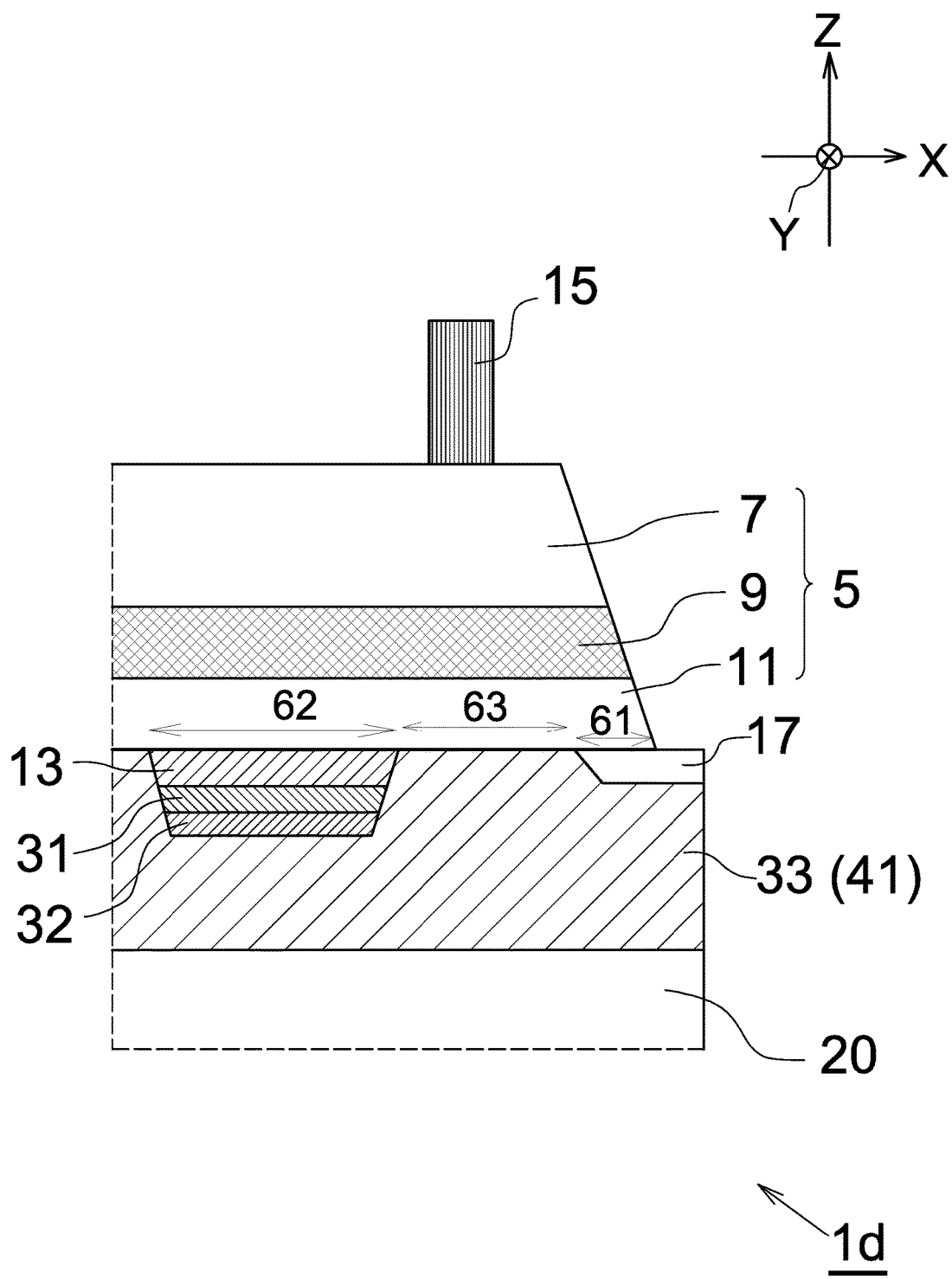
FIG. 8D is a partial enlarged view of FIG. 8C.

As illustrated in FIG. 8C, it is also possible that a first electrode 13 is not formed in a region not facing a second electrode 15 in a Z direction. FIG. 8D is a partial enlarged view of FIG. 8C. Meanwhile, although a light emitting element 1d illustrated in FIGS. 8C and 8D is provided with a first protective layer 31 and a second protective layer 32 on the lower side of the first electrode 13, these layers are dispensable.

Figure 8E:
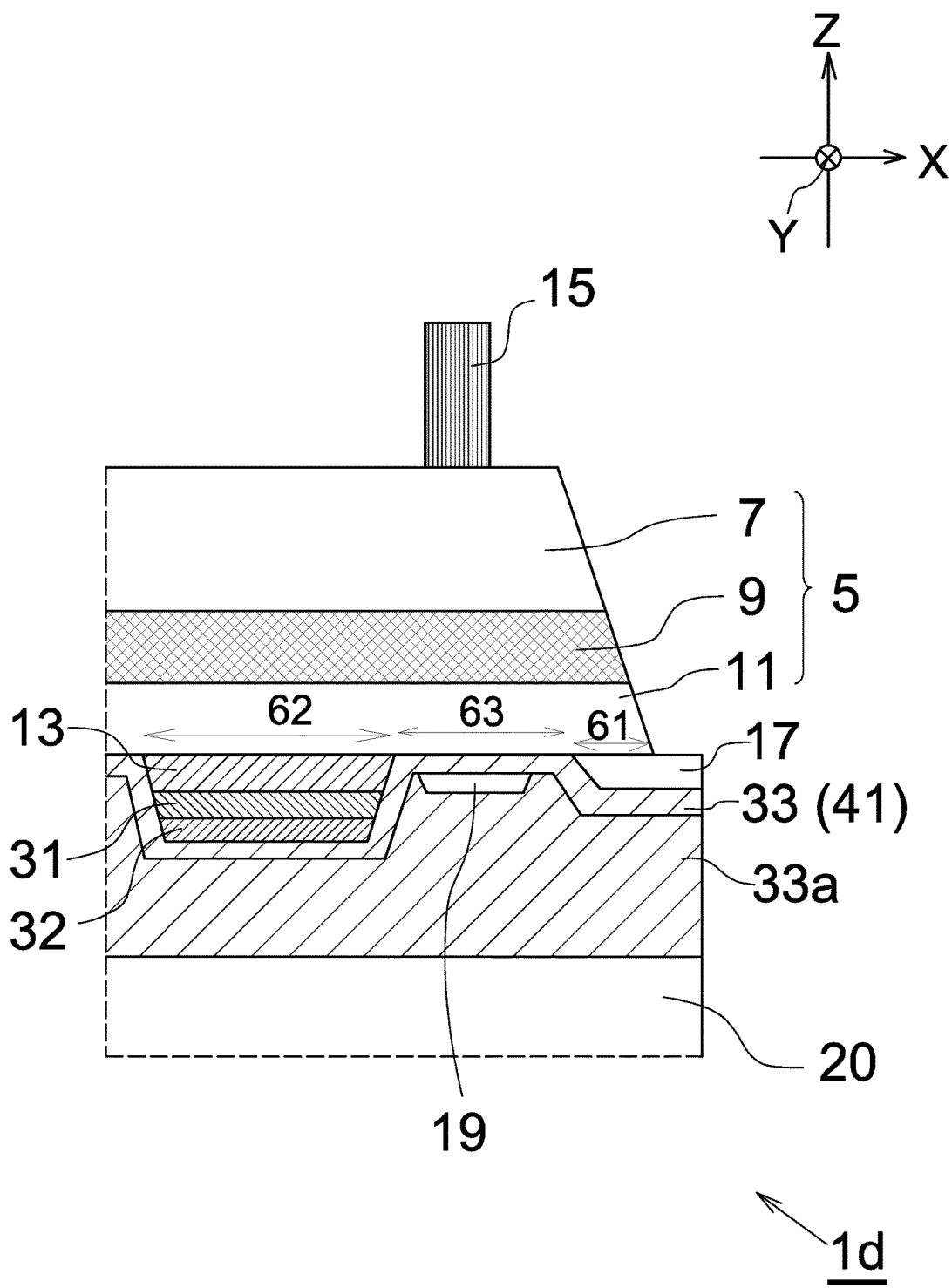
FIG. 8E is a partial enlarged cross-sectional view schematically illustrating another configuration example of the semiconductor light emitting element of the fifth embodiment.

Furthermore, as illustrated in FIG. 8E, a second insulating layer 19 may be provided on the lower side of a third protective layer 33 in a third region 63. The light emitting element 1d may be manufactured by depositing the third protective layer (33, 33a) in two steps.

Figure 8F:
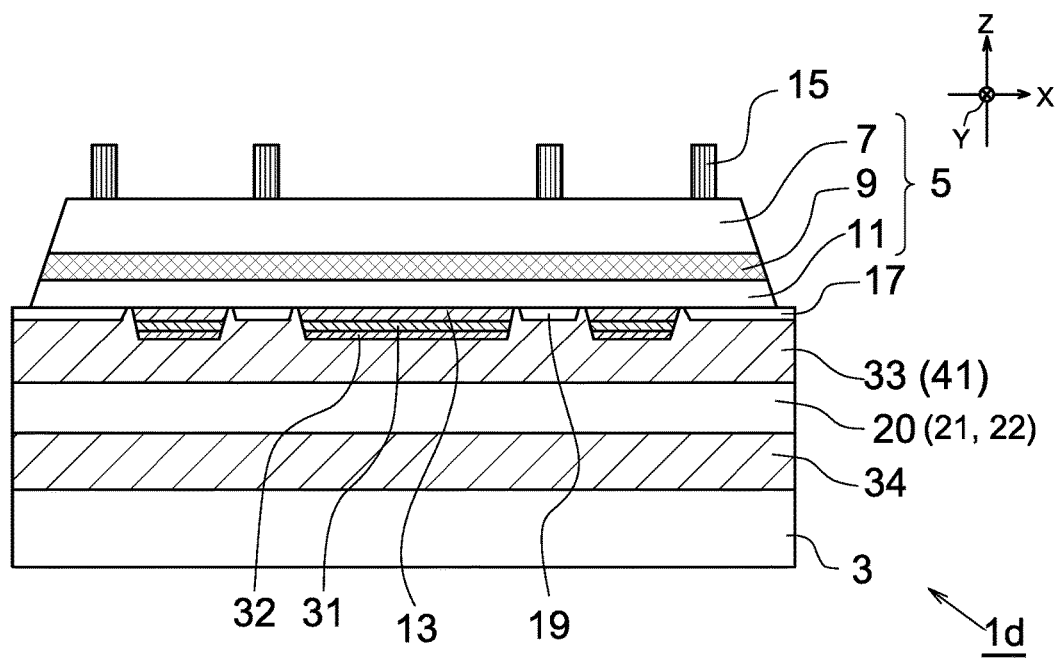
FIG. 8F is a cross-sectional view schematically illustrating another configuration example of the semiconductor light emitting element of the fifth embodiment.

Also, as illustrated in FIG. 8F, a first insulating layer 17 may be extended to a position facing the second electrode 15 near an outer edge, and the second insulating layer 19 may be provided in a region facing the second electrode 15 provided in the vicinity of the center of the light emitting element 1d.

Sixth Embodiment

Figure 9A:
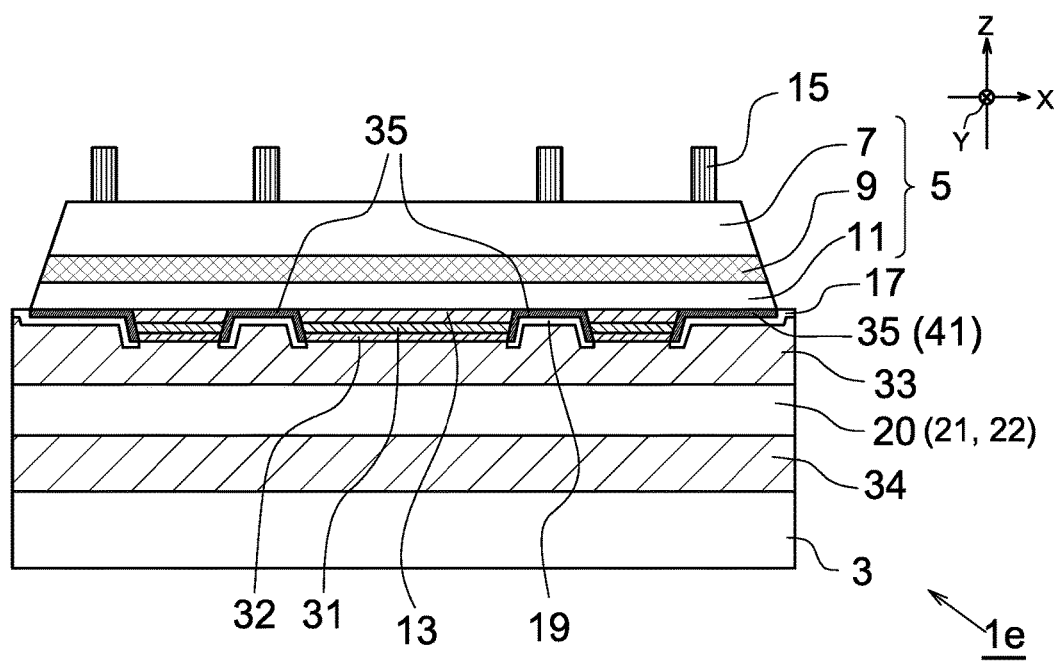
FIG. 9A is a cross-sectional view schematically illustrating a semiconductor light emitting element of a sixth embodiment.
Figure 9B:
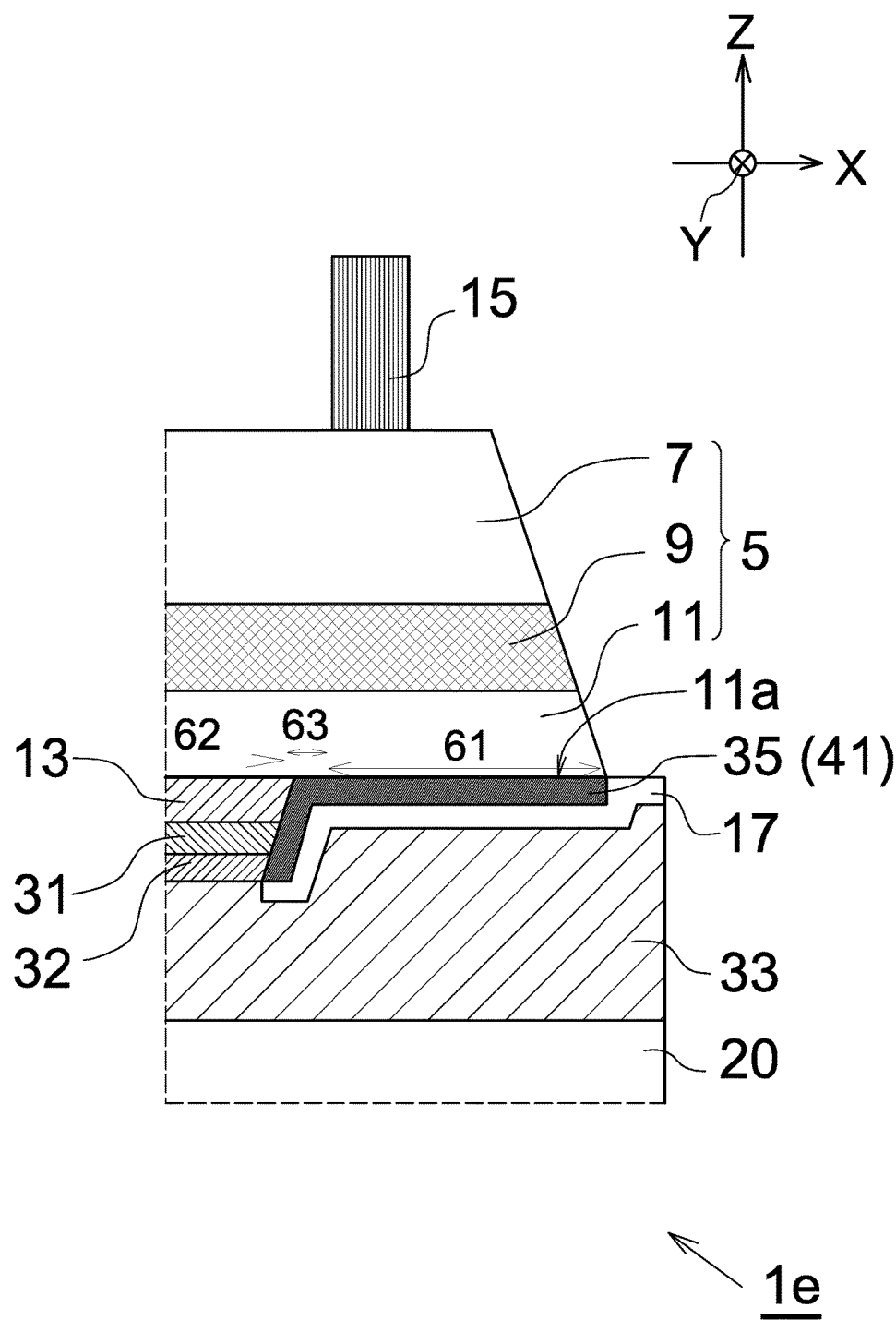
FIG. 9B is a partial enlarged view of FIG. 9A.

In a sixth embodiment of the present invention, a part different from that in the fifth embodiment is described. FIG. 9A is a view schematically illustrating a semiconductor light emitting element 1e of the sixth embodiment. FIG. 9B is a partial enlarged view of FIG. 9A.

The light emitting element 1e is different from the light emitting element 1d illustrated in FIG. 8F in that a second insulating layer 19 is configured to be in contact with a first semiconductor layer 11 via a fifth protective layer 35. The fifth protective layer 35 is made of, for example, Ti. The fifth protective layer 35 is formed to be in contact with a surface on a side of a substrate 3 of the first semiconductor layer 11 and to cover side surfaces of a first electrode 13, a first protective layer 31, and a second protective layer 32.

In an example illustrated in FIG. 9A, the first semiconductor layer 11 and the fifth protective layer 35 are in contact with each other at an outer edge of a semiconductor layer 5, and a first insulating layer 17 is located on the lower side of the fifth protective layer 35. Meanwhile, since the first insulating layer 17 serves as an etching stopper, this is formed so as to protrude outward from the semiconductor layer 5 as in the above-described embodiments.

According to FIG. 9B, a region (first region 61) in which a first surface 11a of the first semiconductor layer 11 and the first insulating layer 17 face each other in a Z direction and a region (second region 62) in which the first surface 11a of the first semiconductor layer 11 and the first electrode 13 face each other in the Z direction are spaced apart from each other in a direction parallel to an X-Y plane. The fifth protective layer 35 is in contact with the first surface 11a of the first semiconductor layer 11 in a region (third region 63) interposed between the first region 61 and the second region 62. Therefore, as in the other embodiments described above, even if air penetrates the inside of the light emitting element 1e through the first insulating layer 17, the fifth protective layer 35 prevents the penetration of the air, so that an amount of air reaching the surface of the first electrode 13 reduces as compared to that in a conventional configuration. That is, in the light emitting element 1e of this embodiment, the fifth protective layer 35 corresponds to a "first conductive layer 41".

Figure 9C:
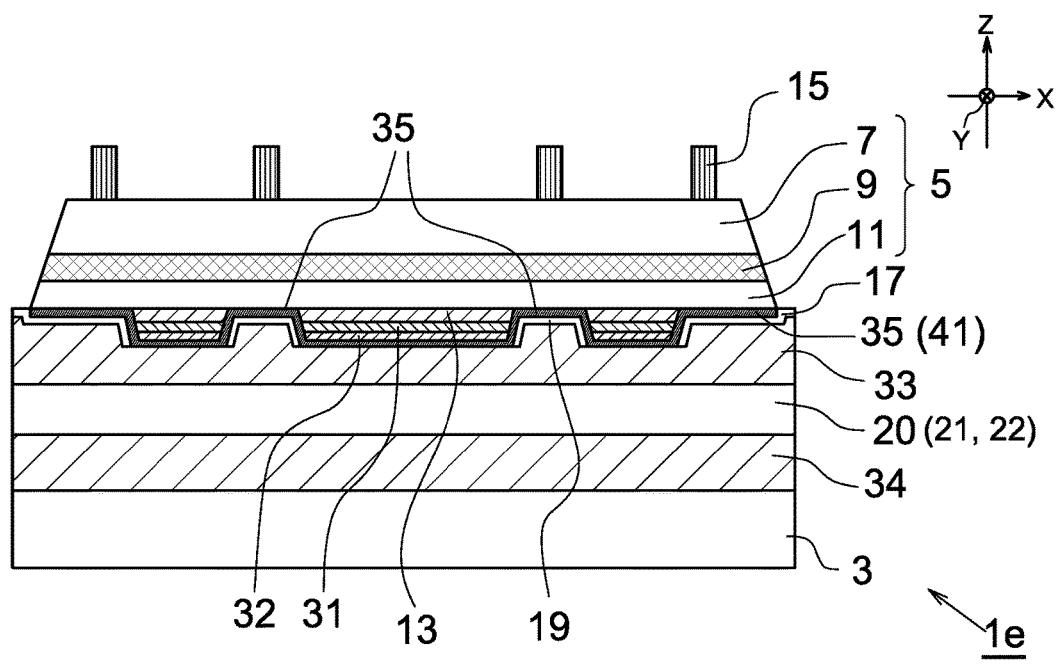
FIG. 9C is a cross-sectional view schematically illustrating another configuration example of the semiconductor light emitting element of the sixth embodiment.

Meanwhile, as illustrated in FIG. 9C, the fifth protective layer 35 may also be formed to cover a bottom surface of a second protective layer 32. Also, in configurations of FIGS. 9A and 9C, a part of the second insulating layer 19 may be in contact with a bottom surface of the fifth protective layer 35.

Another Embodiment

A configuration of another embodiment is hereinafter described.

<1> It is also possible that light emitting elements (1a, 1b, 1c) of the second, third, and fourth embodiments described above are not provided with a second insulating layer 19. In this case, in order to spread a current flowing through an active layer 9 in a direction parallel to an X-Y plane, a first electrode 13 and a first semiconductor layer 11 may be in Schottky contact with each other in a region facing a second electrode 15 in a Z direction.

In a light emitting element 1d of the fifth embodiment illustrated in FIGS. 8C and 8D also, in order to spread the current flowing through the active layer 9 in the direction parallel to the X-Y plane, the first electrode 13 and a third protective layer 33 may be in Schottky contact with each other in the region facing the second electrode 15 in the Z direction.

Figure 10:
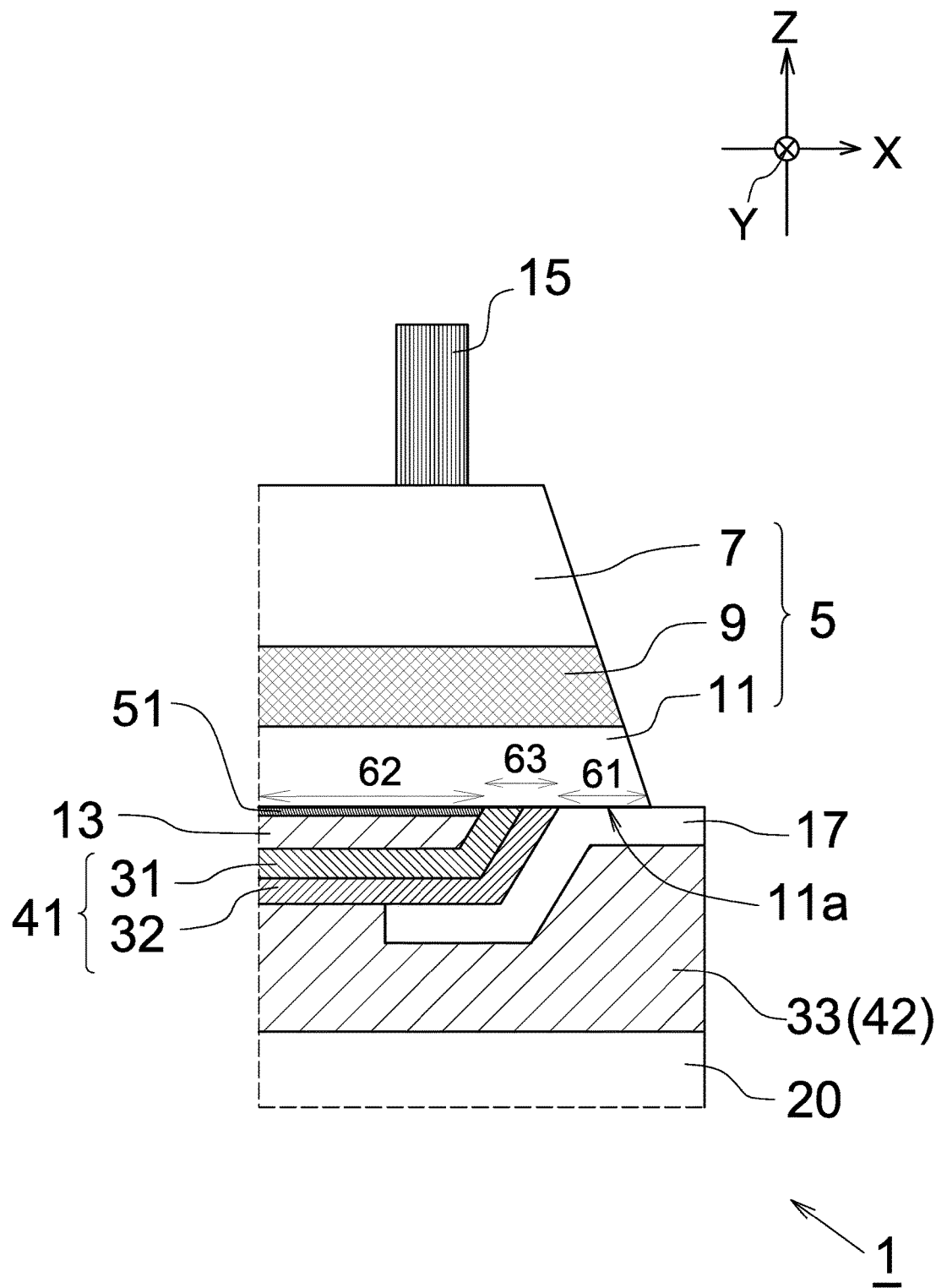
FIG. 10 is a partial enlarged cross-sectional view schematically illustrating a semiconductor light emitting element of another embodiment.

<2> In each embodiment described above, although a case where the first electrode 13 is in direct contact with the first semiconductor layer 11 is described, the first electrode 13 may also be in contact with the first semiconductor layer 11 via a conductive thin film. FIG. 10 illustrates a configuration in which the first electrode 13 is in contact with the first semiconductor layer 11 via the thin film 51 in the light emitting element 1 of the first embodiment illustrated in FIG. 1C. The thin film 51 is made of, for example, Ni. The thin film 51 is provided for the purpose of enhancing ohmic contact between the first electrode 13 and the first semiconductor layer 11. The same applies to the light emitting elements (1a, 1b, 1c, 1d) of the second, third, fourth, and fifth embodiments.

Figure 11:
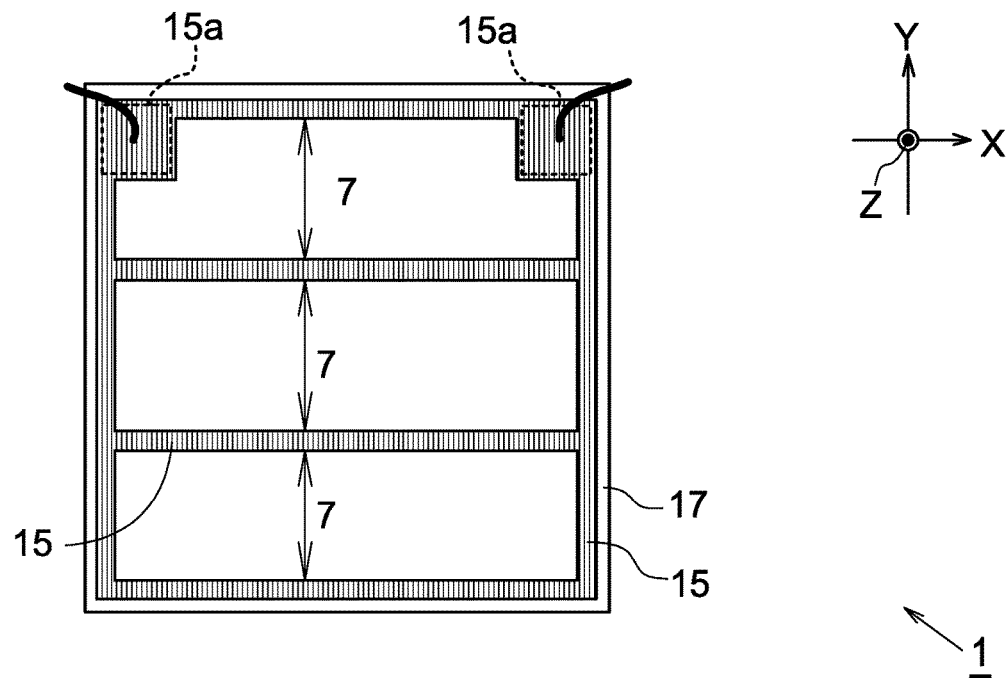
FIG. 11 is a plan view schematically illustrating a semiconductor light emitting element of another embodiment.

<3> In each light emitting element (1, 1a, 1b, 1c, 1d), a shape of the second electrode 15 is arbitrary. For example, as illustrated in FIG. 11, the second electrode 15 may extend in a direction in which pad electrodes 15a face each other (in X direction in the drawing). Also, the extending direction of the second electrode 15 is not limited to the X direction or the Y direction, and may be an oblique direction or a direction along a curve.

However, as illustrated in FIG. 1 and FIG. 11, it is preferable that the second electrode 15 be formed in a frame shape along the shape of the substrate 3. By adopting such a configuration, it is possible to prevent concentration of an electric field in a specific site of the second electrode 15, so that an effect of suppressing migration may be enhanced.

<4> In the above-described embodiment, it is described that the first semiconductor layer 11 is a p-type semiconductor layer and the second semiconductor layer 7 is an n-type semiconductor layer, but the conductivity type may be reversed.

<5> In the above-described embodiments, a case where the second insulating layer 19 is formed so as to be in contact with the first conductive layer 41 is described. However, another layer (sixth protective layer 36) may also be interposed between the second insulating layer 19 and the first conductive layer 41 (refer to FIG. 12).

Figure 12:
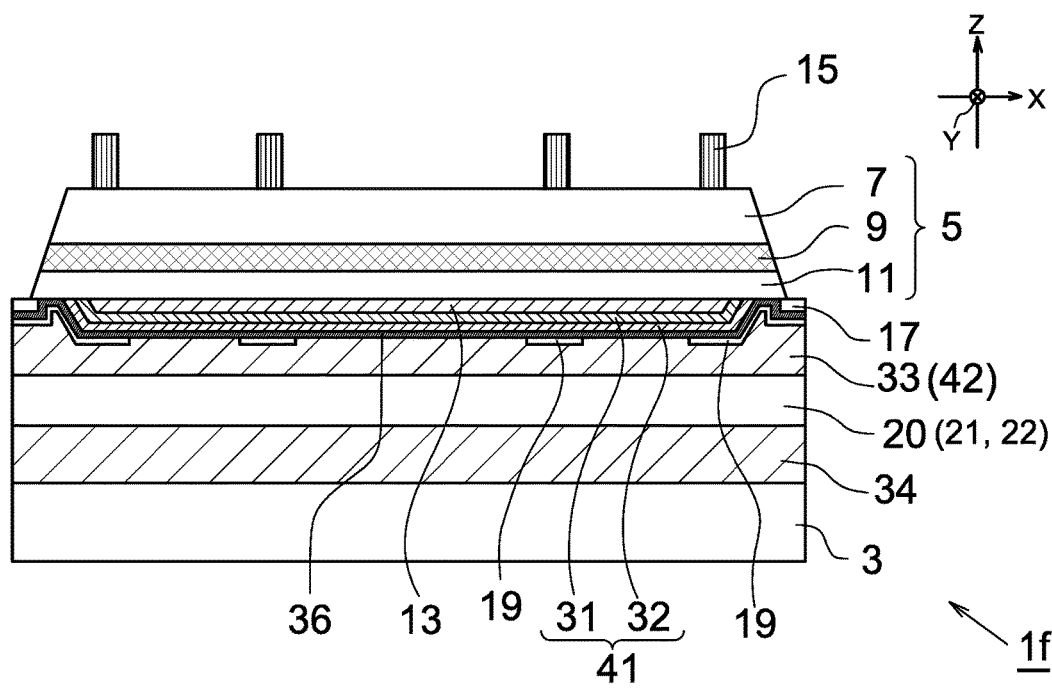
FIG. 12 is a cross-sectional view schematically illustrating a semiconductor light emitting element of another embodiment.
Figure 13:
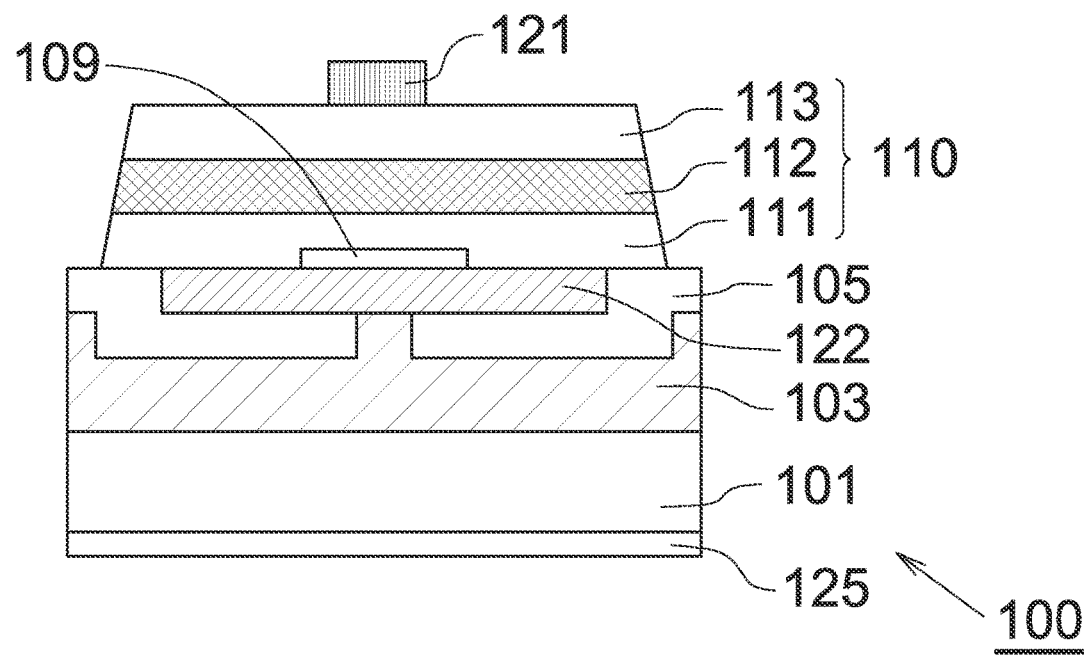
FIG. 13 is a cross-sectional view schematically illustrating a conventional semiconductor light emitting element.
Figure 14A:
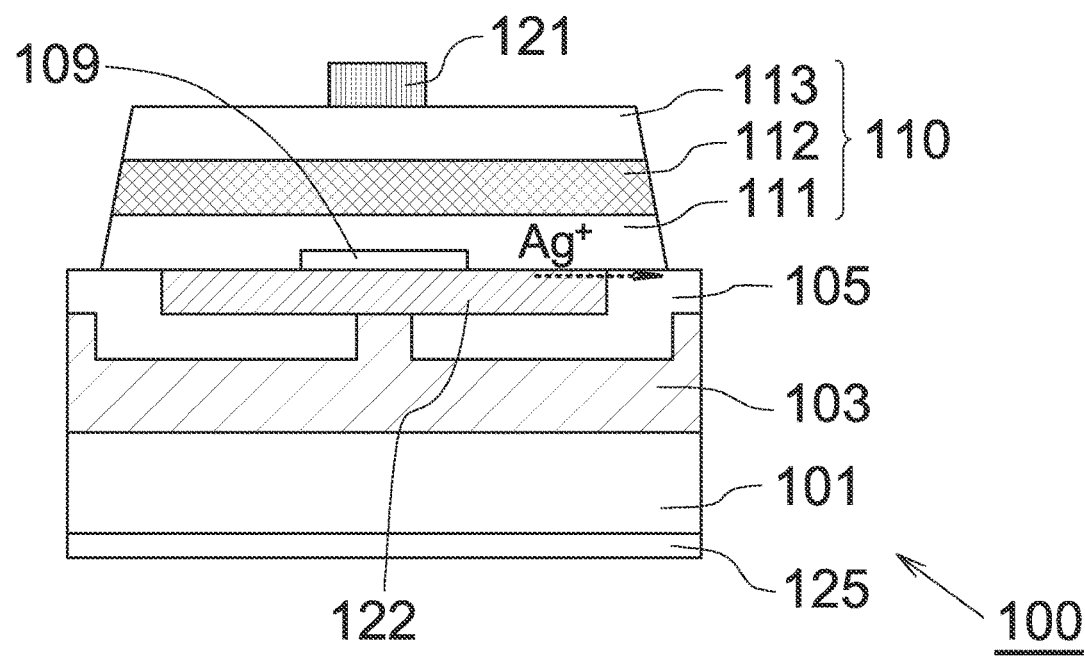
FIG. 14A is a view schematically illustrating a state in which migration occurs in a conventional semiconductor light emitting element.
Figure 14B:
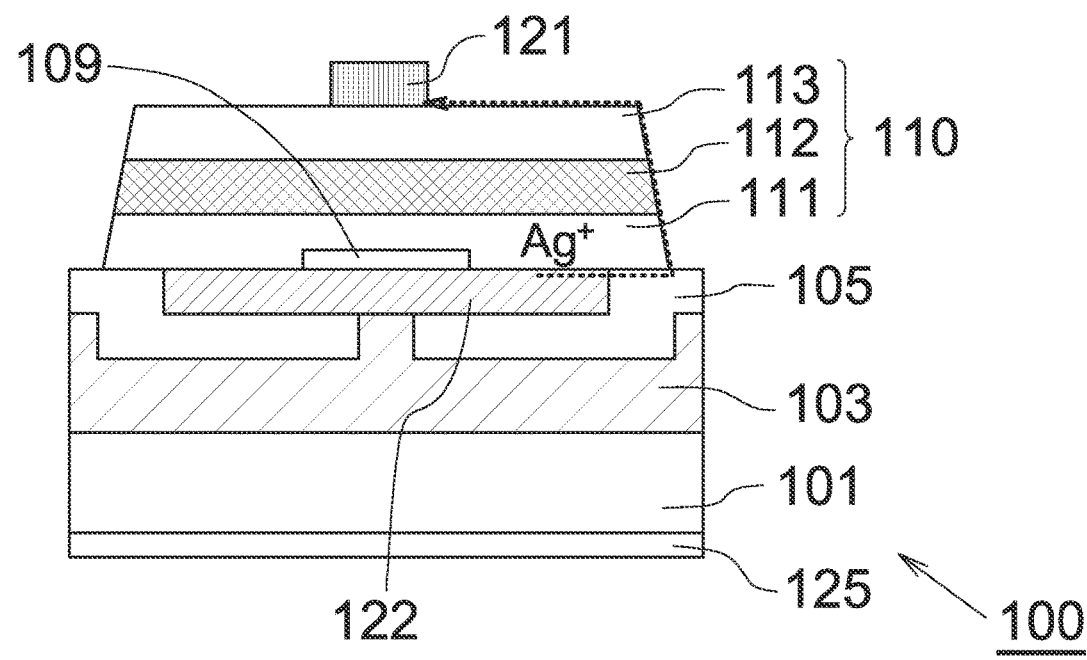
FIG. 14B is a view schematically illustrating a state in which the migration further progresses from the state of FIG. 14A.

The sixth protective layer 36 included in the light emitting element if illustrated in FIG. 12 is formed so as to cover a surface on a side of the substrate 3 of the first conductive layer 41 and side surfaces thereof. The sixth protective layer 36 is made of, for example, Ti/Pt. The second insulating layer 19 is formed in a position facing the second electrode 15 in the Z direction, and the third protective layer 33 is formed on the lower side of the second insulating layer 19. Meanwhile, in the light emitting element 1f, the second insulating layer 19 is formed also in a position facing the second electrode 15 formed in a position closest to the outer edge in the Z direction, as is the case with the light emitting element 1b illustrated in FIG. 6A and the light emitting element 1c illustrated in FIG. 7A.

Although FIG. 12 illustrates that the second insulating layer 19 extends to a position facing the first insulating layer 17 in the Z direction, this structure is an example. The second insulating layer 19 may be formed inside the first insulating layer 17 as seen in the Z direction.

<6> The present invention does not exclude a configuration realized by arbitrarily combining the configurations described in the embodiments. For example, in the first, second, third, or fourth embodiment, as illustrated in FIG. 8C described above, it is also possible that the first electrode 13 is not formed in the region facing the second electrode 15 in the Z direction.

DESCRIPTION OF REFERENCE SIGNS

1, 1a, 1b, 1c, 1d, 1e, 1f Semiconductor light emitting element
3 Substrate
5 Semiconductor layer
7 Second semiconductor layer
9 Active layer
11 First semiconductor layer
11a Surface on side of substrate of first semiconductor layer (first surface)
13 First electrode
15 Second electrode
15a Pad electrode
16 Wire
17 First insulating layer
19 Second insulating layer
20, 21, 22 Bonding layer
25 Growth substrate
26 Undoped layer 31 First protective layer
32 Second protective layer
33, 33a Third protective layer
34 Fourth protective layer
35 Fifth protective layer
36 Sixth protective layer
41 First conductive layer
42 Second conductive layer
43 Third conductive layer
44 Fourth conductive layer
51 Thin film
61 First region
62 Second region
63 Third region
100 Conventional semiconductor light emitting element
101 Substrate
103 Metal layer
105 Insulating layer
109 Current blocking layer
110 Semiconductor layer
111 p-type semiconductor layer
112 Active layer
113 n-type semiconductor layer
121 n-side electrode
122 p-side electrode
125 Power supply electrode

The invention claimed is:

1. A semiconductor light emitting element comprising an n-type or p-type first semiconductor layer on a substrate, an active layer on the upper side of the first semiconductor layer, and a second semiconductor layer on the upper side of the active layer having a conductivity type different from the conductivity type of the first semiconductor layer, the semiconductor light emitting element comprising:
a first insulating layer formed in a position closer to the substrate than the first semiconductor layer in a first direction orthogonal to a surface of the substrate and formed so as to protrude outward from a first surface of the first semiconductor layer, the first surface of the first semiconductor layer facing the substrate in the first direction;
a bonding layer including a solder material formed on the upper side of the substrate;
a first electrode made of a high reflective material located inside the first insulating layer as seen in the first direction and formed so as to be in contact with the first surface directly or via a thin film; and
a second electrode formed so as to be in contact with a surface of the second semiconductor layer opposite to a side of the second semiconductor layer that faces the substrate, wherein
a first region, where the first surface and the first insulating layer face each other, and a second region, where the first surface and the first electrode face each other, are spaced apart in a second direction parallel to the surface of the substrate,
a first conductive layer in contact with the first surface in a third region is interposed between the first region and the second region in the second direction, the first conductive layer being formed of a material having higher contact resistance to the first surface as compared to the first electrode, and the first conductive layer being formed to connect a surface of the first electrode that faces the substrate, a side surface of the first electrode, and the third region to one another,
a second conductive layer formed of a material different from the material of the first conductive layer, and formed so as to be in contact with a surface of the bonding layer opposite to a surface of the bonding layer that faces the substrate, a surface of the first conductive layer that faces the substrate, and a surface of the first insulating layer that faces the substrate, and
a second insulating layer is formed so as to be spaced apart from the first insulating layer in the second direction, the second insulating layer in contact with another surface of the first conductive layer facing the substrate, the second insulating layer in a position facing the second electrode in the first direction.

2. The semiconductor light emitting element according to claim 1, wherein
in the first conductive layer, a Schottky contact with the first surface is formed in the third region.

3. The semiconductor light emitting element according to claim 1, wherein
the third region is located outside the second electrode as seen in the first direction.

4. The semiconductor light emitting element according to claim 1, wherein
the first electrode is formed of a metal material including at least one of Ag and Al.

5. A semiconductor light emitting element comprising an n-type or p-type first semiconductor layer on a substrate, an active layer on the upper side of the first semiconductor layer, and a second semiconductor layer on the upper side of the active layer having a conductivity type different from the conductivity type of the first semiconductor layer, the semiconductor light emitting element comprising:
a first insulating layer formed in a position closer to the substrate than the first semiconductor layer in a first direction orthogonal to a surface of the substrate and formed so as to protrude outward from a first surface of the first semiconductor layer, the first surface of the first semiconductor layer facing the substrate in the first direction;
a bonding layer including a solder material formed on the upper side of the substrate;
a first electrode made of a high reflective material located inside the first insulating layer as seen in the first direction and formed so as to be in contact with the first surface directly or via a thin film; and
a second electrode formed so as to be in contact with a surface of the second semiconductor layer opposite to a side of the second semiconductor layer that faces the substrate, wherein
a first region, where the first surface and the first insulating layer face each other, and a second region, where the first surface and the first electrode face each other, are spaced apart in a second direction parallel to the surface of the substrate,
a first conductive layer in contact with the first surface in a third region is interposed between the first region and the second region in the second direction, the first conductive layer being formed of a material having higher contact resistance to the first surface as compared to the first electrode, and the first conductive layer being formed to connect a surface of the first electrode that faces the substrate, a side surface of the first electrode, and the third region to one another,
a second conductive layer, which is formed of a material different from the material of the first conductive layer, and formed so as to be in contact with a surface of the bonding layer opposite to a surface of the bonding layer that faces the substrate, a third conductive layer is formed in a position interposed between the first conductive layer and the second conductive layer in the first direction and formed of a material different from the material of the first conductive layer and the second conductive layer, the first conductive layer is formed to extend in the second direction so as to be in contact with a surface of the first insulating layer that faces the substrate, the third conductive layer is formed in a region including a position facing the first insulating layer in the first direction, and a second insulating layer is formed so as to be spaced apart from the first insulating layer in the second direction, the second insulating layer interposed between the third conductive layer and the second conductive layer in a position facing the second electrode in the first direction.

6. The semiconductor light emitting element according to claim 5, wherein in the first conductive layer, a Schottky contact with the first surface is formed in the third region.

7. The semiconductor light emitting element according to claim 5, wherein the third region is located outside the second electrode as seen in the first direction.

8. The semiconductor light emitting element according to claim 5, wherein the first electrode is formed of a metal material including at least one of Ag and Al.

9. A semiconductor light emitting element comprising an n-type or p-type first semiconductor layer on a substrate, an active layer on the upper side of the first semiconductor layer, and a second semiconductor layer on the upper side of the active layer having a conductivity type different from the conductivity type of the first semiconductor layer, the semiconductor light emitting element comprising:

a first insulating layer formed in a position closer to the substrate than the first semiconductor layer in a first direction orthogonal to a surface of the substrate and formed so as to protrude outward from a first surface of the first semiconductor layer, the first surface of the first semiconductor layer facing the substrate in the first direction;

a bonding layer including a solder material formed on the upper side of the substrate;

a first electrode made of a high reflective material located inside the first insulating layer as seen in the first direction and formed so as to be in contact with the first surface directly or via a thin film; and a second electrode formed so as to be in contact with a surface of the second semiconductor layer opposite to a side of the second semiconductor layer that faces the substrate, wherein a first region, where the first surface and the first insulating layer face each other, and a second region, where the first surface and the first electrode face each other, are spaced apart in a second direction parallel to the surface of the substrate, a first conductive layer in contact with the first surface in a third region is interposed between the first region and the second region in the second direction, the first conductive layer formed of a material having higher contact resistance to the first surface as compared to the first electrode, and the first conductive layer is formed so as to be in contact with the first semiconductor layer in at least a part of a region facing the first insulating layer in the first direction and to connect a side surface of the first electrode, the third region, and the first region.

10. The semiconductor light emitting element according to claim 9, wherein in the first conductive layer, a Schottky contact with the first surface is formed in the third region.

11. The semiconductor light emitting element according to claim 9, wherein the third region is located outside the second electrode as seen in the first direction.

12. The semiconductor light emitting element according to claim 9, wherein the first electrode is formed of a metal material including at least one of Ag and Al.

* * * * *